United States Patent
Eum et al.

(10) Patent No.: US 10,854,666 B2
(45) Date of Patent: Dec. 1, 2020

(54) PROTECTIVE FILM COMPOSITION AND METHOD OF MANUFACTURING SEMICONDUCTOR PACKAGE BY USING THE SAME

(71) Applicant: SAMSUNG ELECTRONICS CO., LTD., Suwon-si (KR)

(72) Inventors: Myoung-chul Eum, Asan-si (KR); Hye-kyoung Lee, Suwon-si (KR); Chang-kun Kang, Seoul (KR); Jae-hyun Kim, Hwaseong-si (KR); Kyeong-il Oh, Hwaseong-si (KR); Seung-keun Oh, Hwaseong-si (KR); Chi-hwan Lee, Hwaseong-si (KR)

(73) Assignees: SAMSUNG ELECTRONICS CO., LTD., Suwon-si (KR); DONGJIN SEMICHEM CO., LTD., Hwaseong-si (KR)

( * ) Notice: Subject to any disclaimer, the term of this patent is extended or adjusted under 35 U.S.C. 154(b) by 0 days.

(21) Appl. No.: 16/229,972

(22) Filed: Dec. 21, 2018

(65) Prior Publication Data
US 2019/0245003 A1 Aug. 8, 2019

(30) Foreign Application Priority Data
Feb. 5, 2018 (KR) .................... 10-2018-0014169

(51) Int. Cl.
*G03F 7/09* (2006.01)
*G03F 7/038* (2006.01)
(Continued)

(52) U.S. Cl.
CPC ...... *H01L 27/14687* (2013.01); *C08F 220/18* (2013.01); *C08F 220/28* (2013.01);
(Continued)

(58) Field of Classification Search
CPC . G03F 7/0005; G03F 7/38; G03F 7/40; G03F 7/162; G03F 7/2041; G03F 7/09;
(Continued)

(56) References Cited

U.S. PATENT DOCUMENTS 6,335,224 B1  1/2002  Peterson et al.
8,492,907 B2  7/2013  Takamoto et al.
(Continued)

FOREIGN PATENT DOCUMENTS

JP  5805367  9/2015
KR  101250149  3/2013
(Continued)

*Primary Examiner* — Brian Turner
(74) *Attorney, Agent, or Firm* — F. Chau & Associates, LLC

(57) ABSTRACT

A protective film composition includes a polymer having the following formula:

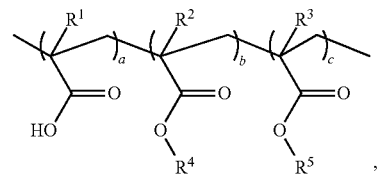

each of a, b, and c is a mole fraction; a+b+c=1; 0.05≤a/(a+b+c)≤0.3; 0.1≤b/(a+b+c)≤0.6; 0.1≤c/(a+b+c)≤0.6; each of $R^1$, $R^2$, and $R^3$ is a hydrogen atom or a methyl group; $R^4$ is a hydrogen atom, a butyrolactonyl group, or a substituted or unsubstituted C3 to C30 alicyclic hydrocarbon group; and $R^5$ is a substituted or unsubstituted C6 to C30 linear or cyclic hydrocarbon group. A method of manufacturing a semiconductor package includes forming a sawing protective film on a semi-
(Continued)

conductor structure by using the protective film composition and sawing the sawing protective film and the semiconductor structure from the sawing protective film.

9 Claims, 13 Drawing Sheets

(51) Int. Cl.
| | |
|---|---|
| G03F 7/16 | (2006.01) |
| H01L 27/146 | (2006.01) |
| H01L 21/78 | (2006.01) |
| C09D 133/08 | (2006.01) |
| C09D 133/14 | (2006.01) |
| C08F 220/18 | (2006.01) |
| C08F 220/28 | (2006.01) |
| C08F 220/30 | (2006.01) |
| H01L 21/683 | (2006.01) |

(52) U.S. Cl.
CPC .......... *C08F 220/30* (2013.01); *C09D 133/08* (2013.01); *C09D 133/14* (2013.01); *H01L 21/6835* (2013.01); *H01L 21/78* (2013.01); *H01L 27/14627* (2013.01); *H01L 27/14632* (2013.01); *H01L 27/14634* (2013.01); *H01L 27/14636* (2013.01); *H01L 27/14645* (2013.01); *H01L 27/14685* (2013.01); *C08F 220/1806* (2020.02); *C08F 220/1807* (2020.02); *C08F 220/1808* (2020.02); *C08F 220/1811* (2020.02); *C08F 220/1818* (2020.02); *C08F 220/281* (2020.02); *C08F 220/282* (2020.02); *C08F 220/301* (2020.02); *C08F 220/302* (2020.02); *C08F 220/305* (2020.02); *H01L 2221/6834* (2013.01); *H01L 2221/68327* (2013.01)

(58) Field of Classification Search
CPC ...... G03F 7/0387; G03F 7/11; H01L 21/0274; B05C 11/08
See application file for complete search history.

(56) References Cited

U.S. PATENT DOCUMENTS

| | | | |
|---|---|---|---|
| 9,688,873 | B2 | 6/2017 | Swarup et al. |
| 2007/0003861 | A1* | 1/2007 | Jung ................ C09D 5/32 430/270.1 |
| 2010/0193967 | A1 | 8/2010 | Takamoto |
| 2011/0048641 | A1 | 3/2011 | Sugimura et al. |
| 2016/0272839 | A1 | 9/2016 | Yamamoto et al. |
| 2016/0333225 | A1 | 11/2016 | Enoki et al. |
| 2018/0120703 | A1* | 5/2018 | Liu ................ G03F 7/0005 |

FOREIGN PATENT DOCUMENTS

| | | |
|---|---|---|
| KR | 1020160083863 | 7/2016 |
| KR | 101647260 | 8/2016 |
| KR | 1020160111385 | 9/2016 |
| KR | 1020170044108 | 4/2017 |
| KR | 101740072 | 5/2017 |

\* cited by examiner

PROTECTIVE FILM COMPOSITION AND METHOD OF MANUFACTURING SEMICONDUCTOR PACKAGE BY USING THE SAME

CROSS-REFERENCE TO RELATED APPLICATION

This application claims priority under 35 U.S.C. § 119 to Korean Patent Application No. 10-2018-0014169, filed on Feb. 5, 2018, in the Korean Intellectual Property Office, the disclosure of which is incorporated by reference herein in its entirety.

TECHNICAL FIELD

Exemplary embodiments of the present inventive concept relate to a protective film composition, and more particularly, to a method of manufacturing a semiconductor package by using the same.

DISCUSSION OF RELATED ART

Semiconductor packages may be relatively small and relatively lightweight electronic devices. Thus, semiconductor packages having a relatively small size may include relatively highly integrated and relatively high performance semiconductor chips. As an example, when a sawing process is performed to individualize semiconductor integrated circuit dies, the integrated circuit dies may be protected from contamination and damage.

SUMMARY

An exemplary embodiment of the present inventive concept provides a protective film composition capable of protecting integrated circuit devices from contamination, or physical damage due to scattering particles during a sawing process for individualizing semiconductor integrated circuit dies.

An exemplary embodiment of the present inventive concept provides a method of manufacturing a semiconductor package such that integrated circuit devices are protected from contamination, or physical damage due to scattering particles during a sawing process for individualizing semiconductor integrated circuit dies.

According to an exemplary embodiment of the present inventive concept, there is provided a protective film composition including a polymer having Formula (1); and a solvent.

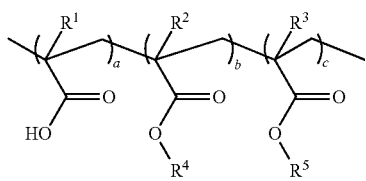

Formula (1)

in which each of a, b, and c is a mole fraction; $a+b+c=1$; $0.05 \leq a/(a+b+c) \leq 0.3$; $0.1 \leq b/(a+b+c) \leq 0.6$; $0.1 \leq c/(a+b+c) \leq 0.6$; each of $R^1$, $R^2$, and $R^3$ is a hydrogen atom or a methyl group; $R^4$ is a hydrogen atom, a butyrolactonyl group, or a substituted or unsubstituted C3 to C30 alicyclic hydrocarbon group; and $R^5$ is a substituted or unsubstituted C6 to C30 linear or cyclic hydrocarbon group.

According to an exemplary embodiment of the present inventive concept, a method of manufacturing a semiconductor package includes forming a semiconductor structure. The method includes forming a sawing protective film on the semiconductor structure by using the protective film composition according to Formula (1). The method includes sawing the sawing protective film and the semiconductor structure from a surface of the sawing protective film.

According to an exemplary embodiment of the present inventive concept, a method of manufacturing a semiconductor package includes forming a semiconductor structure that includes a sensor array region including a plurality of microlenses. The method includes forming a sawing protective film on the semiconductor structure by using the protective film composition according to Formula (1). The sawing protective film substantially covers the plurality of microlenses. The method includes individualizing the semiconductor structure into a plurality of semiconductor dies and dividing the sawing protective film into a plurality of sawing protective patterns. The individualizing is performed by sawing the sawing protective film and the semiconductor structure from a surface of the sawing protective film. The method includes removing the plurality of sawing protective patterns by using an alkaline aqueous solution.

According to an exemplary embodiment of the present inventive concept, a protective film composition includes a polymer having Formula (1) and a solvent.

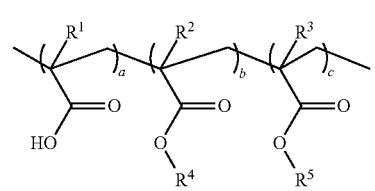

Formula (1)

According to an exemplary embodiment of the present inventive concept, each of a, b, and c is a mole fraction; $a+b+c=1$; $0.05 \leq a/(a+b+c) \leq 0.3$; $0.1 \leq b/(a+b+c) \leq 0.6$; $0.1 \leq c/(a+b+c) \leq 0.6$. Each of $R^1$, $R^2$, and $R^3$ is a hydrogen atom or a methyl group, provided that at least one of $R^1$, $R^2$, and $R^3$ is a methyl group. $R^4$ is a butyrolactonyl group, or a substituted or unsubstituted C3 to C30 alicyclic hydrocarbon group. $R^5$ is a substituted or unsubstituted C6 to C30 linear or cyclic hydrocarbon group.

According to an exemplary embodiment of the present inventive concept, the protective film composition provides a sawing protective film having relatively high transmittance and relatively high adhesion, and thus a chip alignment key may be recognized (e.g., may be readily visible) even though covered with the sawing protective film. As a result of the relatively high adhesion, the sawing protective film is not peeled off or detached from a die surface during a sawing process. In addition, the sawing protective film obtained from the protective film composition according to an exemplary embodiment of the present inventive concept has resistance to physical impacts from outside thereof, and when another material film including an adhesive layer is brought into contact with the sawing protective film and then separated therefrom, the sawing protective film has no reactivity with the adhesive layer and thus is not damaged. Further, after the sawing protective film is formed on a substrate, while back side grinding of the substrate may be performed, the sawing protective film is maintained in a relatively intact state without being broken, and thus a die surface may be effectively protected by the sawing protective film during a sawing process. Further, since the sawing protective film obtained from the protective film composition according an exemplary embodiment of the present inventive concept may be relatively easily and quickly removed by an alkaline aqueous solution, the sawing protective film may be applied to a process of manufacturing a semiconductor package. As an example, the alkaline solution may be a relatively low odor and relatively low toxicity solution (e.g., may be an environmentally friendly solution).

According to an exemplary embodiment of the present inventive concept, since the method of manufacturing a semiconductor package may prevent contamination, physical damage, or the like of integrated circuit devices due to scattering particles during a sawing process for individualizing semiconductor integrated circuit dies, the method may increase a yield for a process of manufacturing a semiconductor package.

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION OF THE EMBODIMENTS

Figure 1:
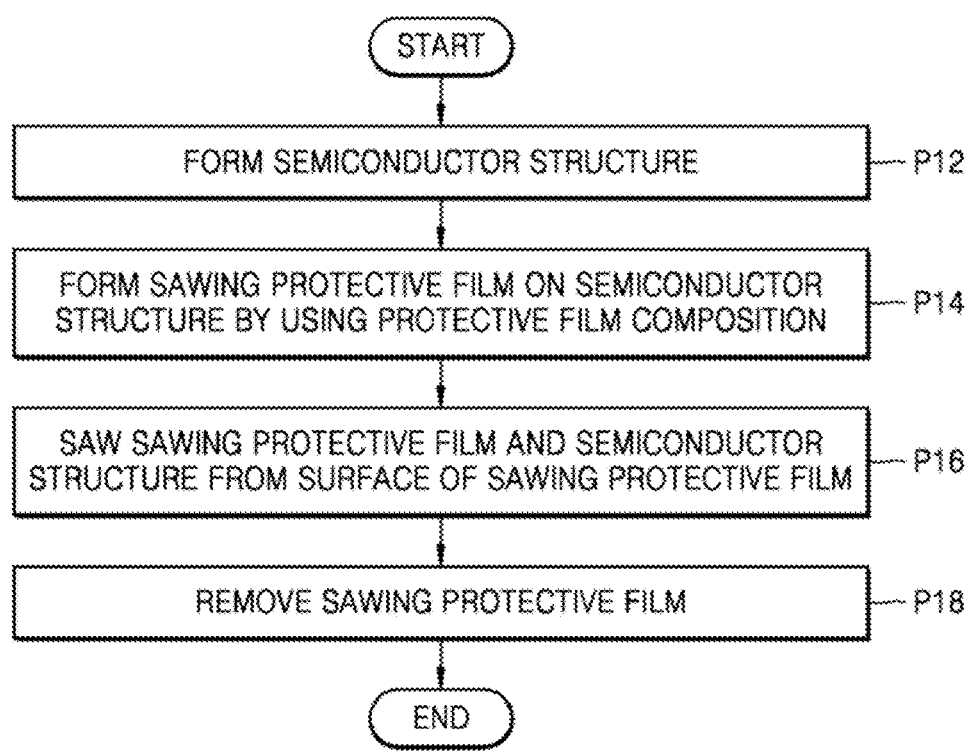
FIG. 1 is a flowchart of a method of manufacturing a semiconductor package according to an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments of the present inventive concept described herein. Like reference numerals may refer to like elements throughout the specification and drawings.

As used herein, the term "protective film" may refer to a film for protecting a plurality of die areas included in a semiconductor structure from contamination or damages during a sawing process for individualizing the plurality of die areas in the manufacture of a semiconductor package or during processes before and/or after the sawing process. As used herein, the term "room temperature" may refer to a temperature of from about 20° C. to about 28° C. and may vary with the seasons.

A process of manufacturing a semiconductor package may include a process of forming integrated circuit devices on a substrate. The process of manufacturing a semiconductor package may include a process of grinding a back side of the substrate by a method such as grinding, rubbing, or polishing. The process of manufacturing a semiconductor package may include a process of separating the substrate including the integrated circuit devices formed thereon into a plurality of dies by sawing the substrate; and a process of individually picking up the separated dies by using a vacuum device and transferring the separated dies to a subsequent process. Surfaces of the dies may be contaminated with various scattering particles during a sawing process. Although some particles may be removed by using deionized water (DIW) jetted at a high pressure during the sawing process, various particles generated depending upon structures of chips undergoing the sawing process may be adsorbed onto the die surfaces, and such adsorbed particles might not be removed merely by a jet of DIW and thus may cause defects of integrated circuits. As an example, in a die including an image sensor which takes a picture of an object and performs conversion into an electrical signal, a plurality of lenses included in an active pixel sensor (APS) array may be exposed on a die surface, and since the plurality of lenses may be sensitive to contamination due to particles, contamination that may occur during the sawing process or during processes before and/or after the sawing process may be prevented according to an exemplary embodiment of the present inventive concept.

An exemplary embodiment of the present inventive concept provides a protective film composition capable of protecting integrated circuit devices from contamination, or physical damages due to scattering particles during a sawing process for individualizing semiconductor integrated circuit dies.

According to an exemplary embodiment of the present inventive concept, the protective film composition may include a polymer having Formula (1); and a solvent.

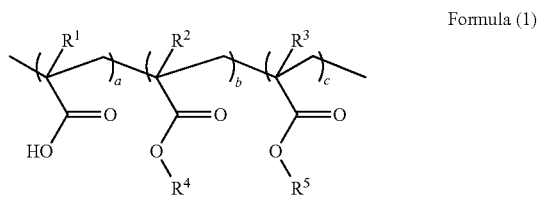

Formula (1)

In Formula (1), according to an exemplary embodiment of the present inventive concept, each of a, b, and c is a mole fraction; $a+b+c=1$; $0.05 \leq a/(a+b+c) \leq 0.3$; $0.1 \leq b/(a+b+c) \leq 0.6$;

$0.1 \leq c/(a+b+c) \leq 0.6$; each of R1, R2, and R3 is a hydrogen atom or a methyl group; R4 is a hydrogen atom, a butyrolactonyl group, or a substituted or unsubstituted C3 to C30 alicyclic hydrocarbon group; and R5 is a substituted or unsubstituted C6 to C30 linear or cyclic hydrocarbon group.

The polymer included in the protective film composition according to an exemplary embodiment of the present inventive concept may have a weight average molecular weight (Mw) of from about 10,000 to about 1,000,000. For example, the polymer may have a weight average molecular weight (Mw) of from about 40,000 to about 1,000,000. If the weight average molecular weight (Mw) of the polymer is less than 10,000, it may be difficult for a sawing protective film obtained from the protective film composition including the polymer to secure required resistance to physical impacts, and thus the sawing protective film may be broken during a sawing process. If the weight average molecular weight (Mw) of the polymer is greater than 1,000,000, when the sawing protective film is removed after the completion of the sawing process, the sawing protective film might not be completely peeled off and removed and may remain on dies.

An amount of the polymer having Formula (1) may be variously determined depending, for example, upon a thickness of the sawing protective film to be formed, and the polymer may be included in the protective film composition according to an exemplary embodiment of the present inventive concept. For example, when the sawing protective film having a thickness of from about 1 μm to about 10 μm is to be formed, the polymer having Formula (1) may be present in an amount of from about 10% by weight (wt %) to about 50 wt % in the protective film composition based on a total weight of the protective film composition.

In an exemplary embodiment of the present inventive concept, at least one of $R^4$ and $R^5$ in Formula (1) may include an ether group, a carbonyl group, an ester group, or a hydroxyl group.

In an exemplary embodiment of the present inventive concept, at least one of $R^4$ and $R^5$ in Formula (1) may include at least one heteroatom selected from among O, S, or N.

In an exemplary embodiment of the present inventive concept, $R^4$ in Formula (1) may have a structure selected from among the following structures:

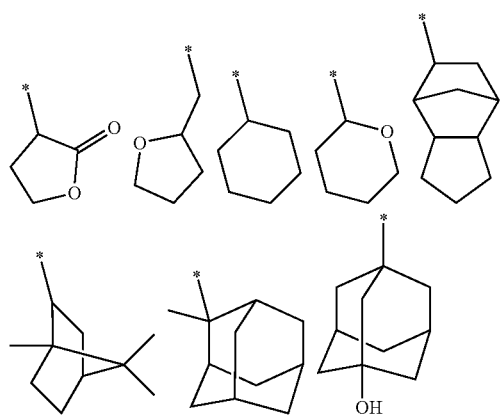

The symbol "*" represents a binding site.

$R^5$ in Formula (1) may have a structure selected from among the following structures:

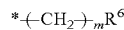

According to an exemplary embodiment of the present inventive concept, the symbol "*" represents a binding site; m is an integer selected from 2 to 15; n is an integer selected from 1 to 10; R6 is a hydrogen atom, a methyl group, or a t-butyl group; and R7 is a methyl group, a phenyl group, a C1 to C10 alkyl group-substituted phenyl group, or a C3 to C10 alkylcarbonyl group.

In an exemplary embodiment of the present inventive concept, $R^5$ may have a structure selected from among the following structures:

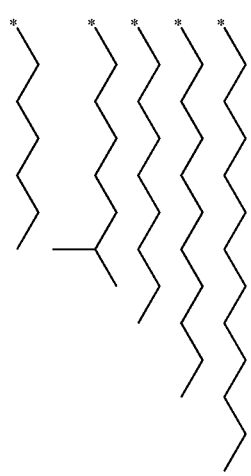

In an exemplary embodiment of the present inventive concept, the symbol "*" represents a binding site.

In an exemplary embodiment of the present inventive concept, $R^5$ may have a structure selected from among the following structures:

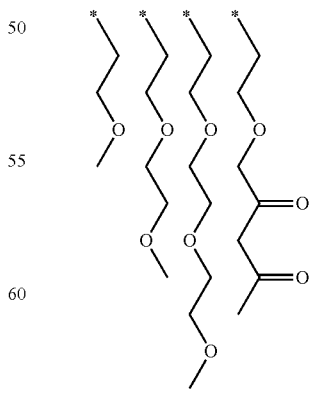

In an exemplary embodiment of the present inventive concept, the symbol "*" represents a binding site.

In an exemplary embodiment of the present inventive concept, $R^5$ may have a structure selected from among the following structures:

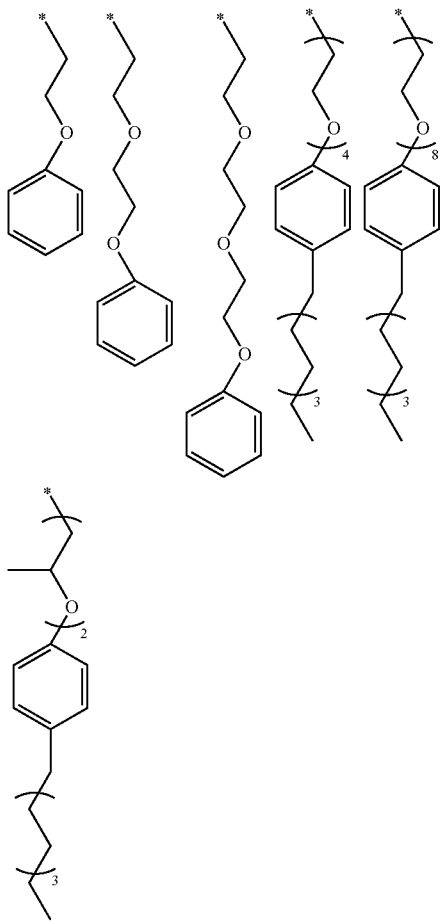

In an exemplary embodiment of the present inventive concept, the symbol "*" represents a binding site.

According to an exemplary embodiment of the present inventive concept, a protective film composition includes a polymer having Formula (1) and a solvent.

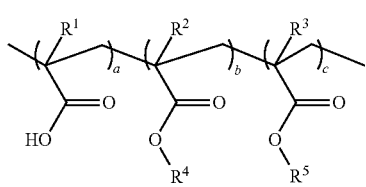

Formula (1)

According to an exemplary embodiment of the present inventive concept, each of a, b, and c is a mole fraction; a+b+c=1; 0.05≤a/(a+b+c)≤0.3; 0.1≤b/(a+b+c)≤0.6; 0.1≤c/(a+b+c)≤0.6. Each of $R^1$, $R^2$, and $R^3$ is a hydrogen atom or a methyl group, provided that at least one of $R^1$, $R^2$, and $R^3$ is a methyl group. $R^4$ is a butyrolactonyl group, or a substituted or unsubstituted C3 to C30 alicyclic hydrocarbon group. $R^5$ is a substituted or unsubstituted C6 to C30 linear or cyclic hydrocarbon group.

In Formula (1), a monomer unit marked by "a" (which may be referred to herein as "monomer unit a") may contribute to providing relatively high solubility with respect to an alkaline aqueous solution that may be used to remove the sawing protective film obtained from the protective film composition according to an exemplary embodiment of the present inventive concept. The alkaline aqueous solution, for example, a tetramethylammonium hydroxide (TMAH) aqueous solution having a concentration of from about 0.5 wt % to about 5 wt %, may have relatively low toxicity and relatively low foul odor, and thus may increase environmental friendliness when used to remove the sawing protective film. In the polymer having Formula (1), if a mole fraction of the monomer unit a is less than 0.05, the sawing protective film obtained from the protective film composition, which includes the polymer having Formula (1), might not be easily removed by the alkaline aqueous solution. If the mole fraction of the monomer unit a is greater than 0.3, the sawing protective film may be dissolved by DIW during the sawing process and thus might not function as a protective film for protecting the dies.

In Formula (1), a monomer unit marked by "b" (which may be referred to herein as "monomer unit b") may control rigidity of the polymer and may provide adhesive properties to Formula (1). In the polymer having Formula (1), if a mole fraction of the monomer unit b is less than 0.1, the sawing protective film obtained from the protective film composition, which includes the polymer having Formula (1), may be stickier than desired, and if the mole fraction of the monomer unit b is greater than 0.6, the sawing protective film may have too high of a rigidity and thus may be relatively likely to be broken by physical impacts external thereto.

In Formula (1), a monomer unit marked by "c" (which may be referred to herein as "monomer unit c") may control flexibility of the polymer. In the polymer having Formula (1), if a mole fraction of the monomer unit c is less than 0.1, the sawing protective film obtained from the protective film composition, which includes the polymer having Formula (1), may be relatively likely to be broken by physical impacts external thereto, and if the mole fraction of the monomer unit c is greater than 0.6, the sawing protective film may be stickier than desired.

The solvent included in the protective film composition according to an exemplary embodiment of the present inventive concept may prevent the generation of coating stains and may increase coating uniformity when the protective film composition is coated on semiconductor dies, thus providing a substantially uniform coating film having a substantially flat top surface.

In an exemplary embodiment of the present inventive concept, the solvent may include an organic solvent. For example, the solvent may include N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxypropionate, or combinations thereof.

In an exemplary embodiment of the present inventive concept, the protective film composition according to an exemplary embodiment of the present inventive concept may further include a silane compound. The silane compound may increase adhesion to die surfaces to which the protective film composition is applied. When the silane compound is included in the protective film composition according to an exemplary embodiment of the present inventive concept, the silane compound may be present in an amount of from about 0.01 wt % to about 15 wt % based on a total weight of the polymer having Formula (1). If the amount of the silane compound is greater than 15 wt %, there may be a decrease in storage stability of the protective film composition due to a self-crosslinking reaction of the silane compound.

For example, the silane compound may include N-(2-aminoethyl)-3-aminopropyltriethoxysilane, N-phenylaminoethyltrimethoxysilane, N-phenylaminoethyltriethoxysilane, N-phenylaminopropyltrimethoxysilane, N-phenylaminopropyltriethoxysilane, N-phenylaminobutyltrimethoxysilane, N-phenylaminobutyltriethoxysilane, vinyltrimethoxysilane, vinyltriethoxysilane, vinyltrichlorosilane, vinyltris(β-methoxyethoxy)silane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane, or combinations thereof, without being limited thereto.

In an exemplary embodiment of the present inventive concept, the protective film composition according to an exemplary embodiment of the present inventive concept may further include a surfactant. The surfactant may further increase the coating uniformity of the protective film composition according to an exemplary embodiment of the present inventive concept. When the sawing protective film obtained from the protective film composition is removed by the alkaline aqueous solution, the surfactant may allow the sawing protective film to be more easily removed. When the surfactant is included in the protective film composition according to an exemplary embodiment of the present inventive concept, the surfactant may be present in an amount of from about 0.001 wt % to about 0.01 wt % based on the total weight of the polymer having Formula (1).

Examples of the surfactant may include: polyoxyethylene octylphenyl ether; polyoxyethylene nonylphenyl ether; product models F171, F172, and F173 commercially available from Dainippon Ink and Chemicals Co., Ltd.; product models FC430 and FC431 commercially available from Sumitomo teuriem Co., Ltd.; or a product model KP341 commercially available from Shin-Etsu Chemical Co., Ltd, without being limited thereto.

The polymer having Formula (1) and included in the protective film composition according to an exemplary embodiment of the present inventive concept may include of a (meth)acrylate monomer unit. The (meth)acrylate monomer unit may have relatively high transmittance. Thus, during the sawing process, even when a chip alignment key formed in a die is covered with the sawing protective film obtained from the protective film composition, the chip alignment key may be sufficiently recognized by a sawing machine. For example, the sawing protective film may be sufficiently transparent that the chip alignment key is visible to either a machine operator or to a sensor of an automated sawing machine. Therefore, there is no need for a separate process for the recognition of the chip alignment key in the sawing process. In addition, the (meth)acrylate monomer unit may have relatively strong adhesion. Therefore, during the sawing process, the sawing protective film obtained from the protective film composition may effectively protect the die surfaces without being peeled off or detached from the die surfaces.

The protective film composition according to an exemplary embodiment of the present inventive concept might not include a material capable of inducing a chemical reaction of the polymer having Formula (1), for example, a reactive material such as a potential acid. As used herein, the term "potential acid" may refer to a material generating acid under a specific condition, for example, an acid generator such as a photoacid generator (PAG), or a thermal acid generator (TAG). Since the protective film composition according to an exemplary embodiment of the present inventive concept does not include a reactive material capable of inducing a chemical reaction of the polymer having Formula (1), a change in a chain structure of the polymer having Formula (1) may be prevented while the sawing protective film is formed from the protective film composition. Thus, the sawing protective film may secure strength and thus secure resistance to physical impacts from outside thereof. In addition, the polymer having Formula (1) and included in the protective film composition according to an exemplary embodiment of the present inventive concept may have relatively low reactivity with other material films, for example, exposed surfaces of the dies, or lamination films used in a process of manufacturing a semiconductor package. Therefore, in the process of manufacturing a semiconductor package, when the sawing protective film obtained from the protective film composition is bonded to another material film having an adhesive layer and then separated from the other material film, portions of the sawing protective film remaining on the other material film and damage of the sawing protective film may be prevented. For example, after the sawing protective film is formed on the die surfaces, when a certain process, for example, a back side grinding process of a substrate, is performed while a lamination film is bonded onto the sawing protective film, followed by separating the lamination film from the sawing protective film before the sawing process, an occurrence of portions of the sawing protective film clinging to the lamination film and thus being removed from the dies together with the lamination film may be prevented. Further, an occurrence of the sawing protective film being partially detached from the dies may be prevented. Therefore, after the sawing protective film is formed on the die surfaces, even though processes of bonding the lamination film onto the sawing protective film and separating the lamination film from the sawing protective film may be added before the sawing process, the die surfaces may be effectively protected by the sawing protective film during the subsequent sawing process.

The protective film composition according to an exemplary embodiment of the present inventive concept may be used to form the sawing protective film having a minimum thickness sufficient to protect the dies in the sawing process, for example, a thickness of at least 1.0 rm.

The sawing protective film obtained from the protective film composition according to an exemplary embodiment of the present inventive concept might not suffer from swelling due to DIW. Therefore, during the sawing process, since the swelling of the sawing protective film due to DIW does not occur even when a high-pressure jet of DIW is applied onto the sawing protective film, detachment of the sawing protective film from the dies due to the swelling during the sawing process may be prevented.

The protective film composition according to an exemplary embodiment of the present inventive concept may be relatively easily and quickly removed by an environmentally friendly alkaline aqueous solution having relatively low toxicity and relatively low foul odor, for example, by a TMAH aqueous solution having a concentration of from about 2 wt % to about 5 wt %. Therefore, when the sawing protective film is used in the sawing process, a semiconductor package may be simply and effectively manufactured even without adding cumbersome or complicated processes. Thus, manufacturing yield may be increased, manufacturing process efficiency may be increased and manufacturing costs may be reduced.

A method of manufacturing a semiconductor package according to an exemplary embodiment of the present inventive concept will be described in more detail below with reference to examples.

FIG. 1 is a flowchart of a method of manufacturing a semiconductor package according to an exemplary embodiment of the present inventive concept.

FIGS. 2A, 2B, 2C and 2D illustrate processes of the method of manufacturing a semiconductor package according to FIG. 1.

Figure 2A:
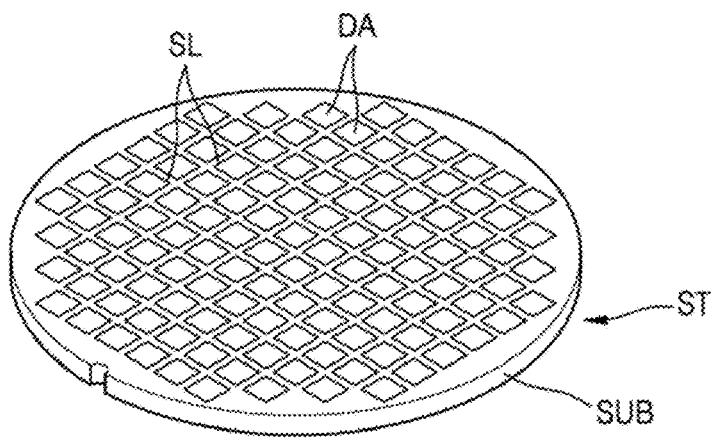
FIGS. 2A, 2B, 2C and 2D illustrate processes of the method of manufacturing a semiconductor package according to FIG. 1.

Referring to FIGS. 1 and 2A, in a process P12 according to an exemplary embodiment of the present inventive concept, a semiconductor structure ST is formed.

In an exemplary embodiment of the present inventive concept, the semiconductor structure ST may include a plurality of die areas DA formed on an active surface of a substrate SUB. The plurality of die areas DA on the substrate SUB may be separated from each other by scribe lanes SL. As an example, the plurality of die areas DA may be arranged in rows and columns of a matrix. As an example, the substrate SUB may be a substantially circular substrate; however, exemplary embodiments of the present inventive concept are not limited thereto. For example, the substrate SUB may have a square or rectangular shape including a plurality of die areas DA arranged thereon.

The substrate SUB may include a semiconductor substrate. In an exemplary embodiment of the present inventive concept, the substrate SUB may further include a multilayer wiring structure and an insulating layer insulating the multilayer wiring structure.

A semiconductor device including a plurality of individual devices of various kinds may be formed in each of the plurality of die areas DA. The plurality of individual devices may include various microelectronic devices, for example, a metal-oxide-semiconductor field effect transistor (MOSFET) such as a complementary metal-oxide-semiconductor (CMOS) transistor, system large scale integration (LSI), an image sensor such as a CMOS imaging sensor (CIS), a micro-electromechanical system (MEMS), an active element, or a passive element. The plurality of individual devices may each be electrically connected to a conductive region of the substrate SUB. Each of the plurality of individual devices may be electrically separated from other individual devices adjacent thereto by an insulating film.

In an exemplary embodiment of the present inventive concept, each of the plurality of die areas DA may include an image sensor. The image sensor may include a CMOS imaging sensor (CIS) which includes an active pixel sensor (APS) array including a plurality of microlenses.

Figure 3A:
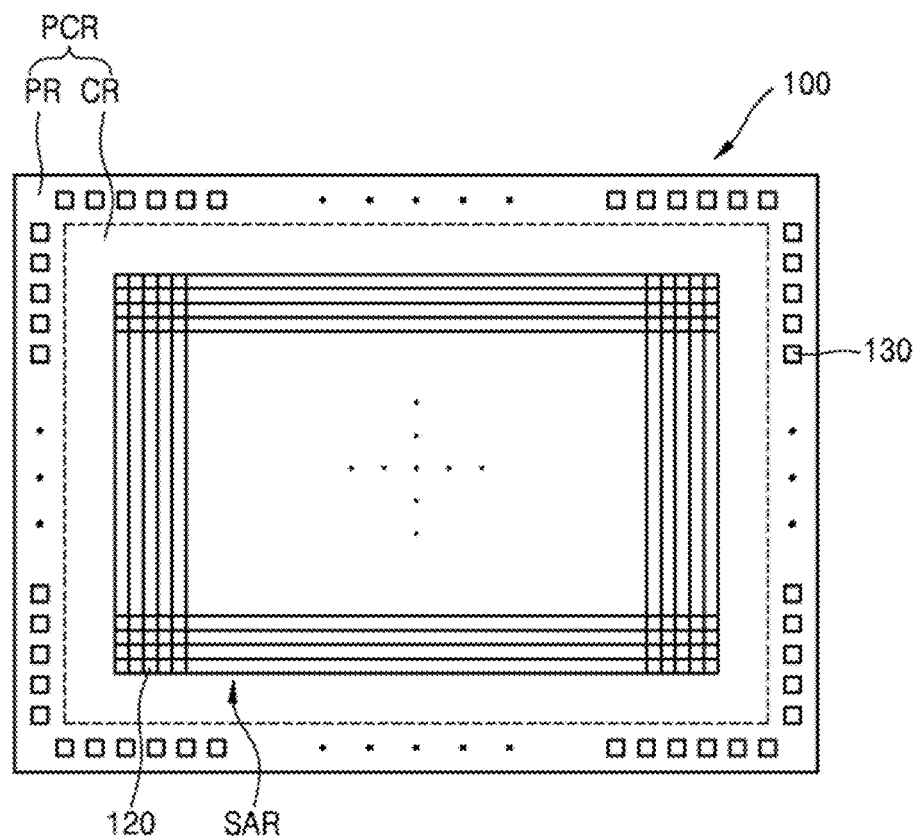
FIG. 3A is a schematic plan view of an image sensor according to an exemplary embodiment of the present inventive concept.
Figure 3B:
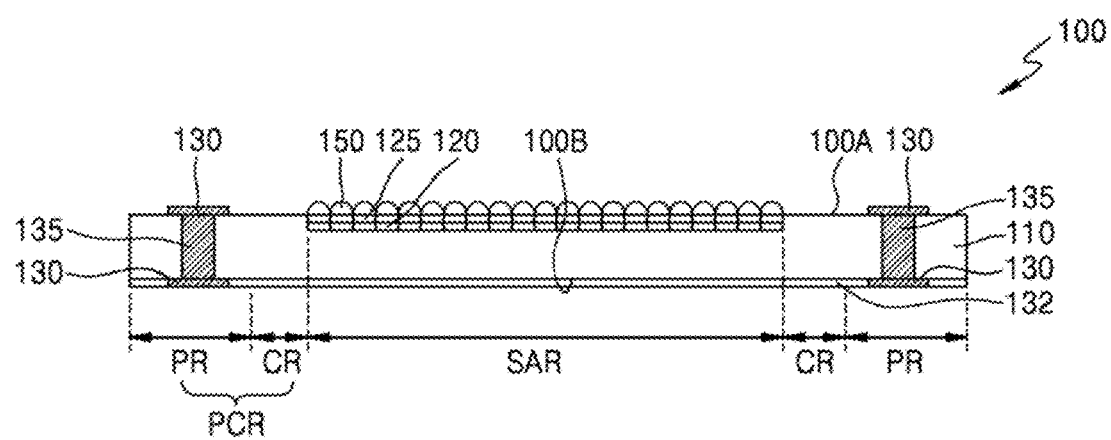
FIG. 3B is a cross-sectional view of the image sensor of FIG. 3A.

FIG. 3A is a schematic plan view of an image sensor according to an exemplary embodiment of the present inventive concept. FIG. 3B is a cross-sectional view of the image sensor of FIG. 3A. The image sensor described with reference to FIG. 3A may be included in each of the plurality of die areas DA described in more detail above with reference to FIG. 2A.

Referring to FIGS. 3A and 3B, the image sensor 100 may include an image sensor main body 110 including a sensor array region SAR, a circuit region CR, and a pad region PR.

In the sensor array region SAR, a pixel array including a plurality of unit pixels 120 arranged in a matrix form may be formed. The circuit region CR may include electronic devices including a plurality of transistors. The circuit region CR may include a wiring structure for providing a signal to a unit pixel 120 of the sensor array region SAR or controlling an output signal. The plurality of unit pixels 120 may each be an active pixel sensor.

In the pad region PR, a plurality of conductive pads 130 may be formed. The plurality of conductive pads 130 may be used to send electrical signals to a package base substrate or devices external to the image sensor 100 and/or to receive electrical signals from the package base substrate and the external devices. The conductive pads 130 may be disposed on a first surface 100A of the image sensor 100. The pad region PR may be arranged around the sensor array region SAR. As an example, the pad regions PR may be arranged at four sides of the sensor array region SAR in a plan view; however, exemplary embodiments of the present inventive concept are not limited thereto. For example, the pad regions PR may be arranged at less than four sides of the sensor array region SAR in a plan view. The plurality of conductive pads 130 may be electrically connected to the plurality of unit pixels 120. The image sensor 100 may include a plurality of wiring structures providing electrical connection between the plurality of conductive pads 130, the electronic devices included in the circuit region CR, and the plurality of unit pixels 120 included in the sensor array region SAR. The circuit region CR and the pad region PR may be included in a peripheral circuit region PCR of the image sensor 100.

Referring to FIG. 3B, the image sensor 100 may include the first surface 100A and a second surface 100B at opposite sides of the images sensor form each other. For example, the first surface 100A of the image sensor 100 may be an upper surface of the image sensor 100 and the second surface 100B of the image sensor 100 may be a bottom surface of the image sensor 100. The plurality of unit pixels 120 may be arranged on the first surface 100A side of the image sensor 100. A plurality of color filters 125 and a plurality of microlenses 150 may be formed on the plurality of unit pixels 120. For example, the color filters 125 may each respectively be in direct contact with the unit pixels 120 and the microlenses 150 may each respectively be in direct contact with the color filters 125.

The plurality of microlenses 150 may concentrate light incident upon the sensor array region SAR onto the plurality of unit pixels 120. When each unit pixel 120 includes a photodiode, the plurality of microlenses 150 may concentrate light incident upon the sensor array region SAR onto photodiodes of the plurality of unit pixels 120. Each of the plurality of microlenses 150 may include, for example, a TMR series resin (commercially available from Tokyo Ohka Kogyo Co., Ltd.) or an MFR series resin (commercially available from Japan Synthetic Rubber Co., Ltd.).

The image sensor 100 may include a plurality of through-silicon via (TSV) contacts 135 penetrating the image sensor 100 such that conductive pads 130 formed on the first surface 100A are respectively electrically connected to conductive pads 130 formed on the second surface 100B. For example, the TSV contacts 135 may full penetrate a thickness of the image sensor body 100. A protective layer 132 may be formed on the second surface 100B, the protective layer 132 having openings exposing the pads 130. The protective layer 132 may include an oxide film, a nitride film, or combinations thereof.

Referring again to FIG. 2A, in an exemplary embodiment of the present inventive concept, each of the plurality of die areas DA may include a logic device.

Figure 4:
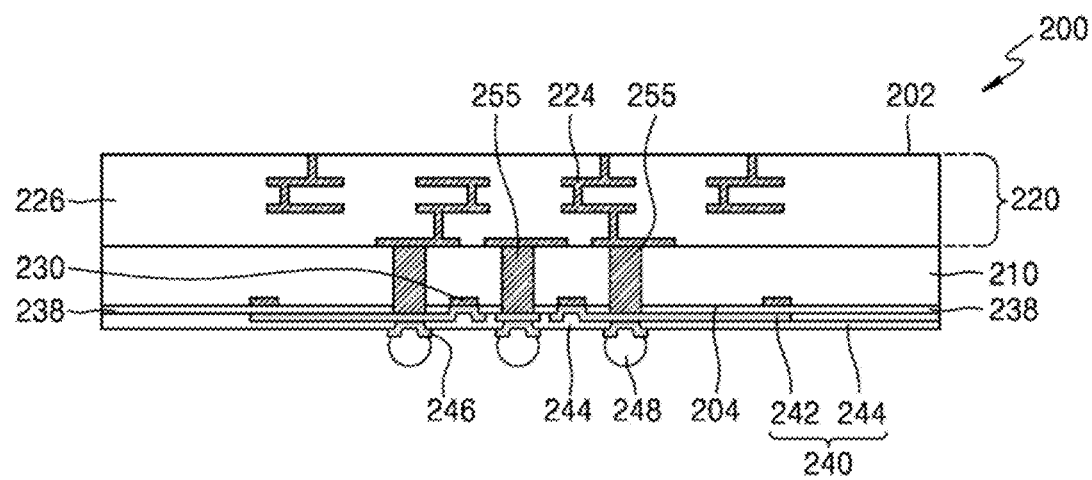
FIG. 4 is a cross-sectional view of a logic device according to an exemplary embodiment of the present inventive concept.

FIG. 4 is a cross-sectional view of a logic device according to an exemplary embodiment of the present inventive concept. The logic device described with reference to FIG. 4 may be included in each of the die areas DA described in more detail above with reference to FIG. 2A.

Referring to FIG. 4, a logic device 200 may include a logic substrate 210, and a wiring structure 220 formed on the logic substrate 210. The logic substrate 210 may be in a position corresponding to the substrate SUB (see, e.g., FIG. 2A). The wiring structure 220 may include a plurality of wiring layers 224. The wiring structure 220 may have a multilayer structure including a plurality of layers of wiring layers 224. An interlayer dielectric 226 may insulate the plurality of wiring layers 224 from each other. The wiring layers 224 may completely penetrate a thickness of the interlayer dielectric 226. Various logic circuits may include some or all of the wiring layers of the plurality of wiring layers 224. The various logic circuits may include a processor; an analog-to-digital converter (ADC), a digital-to-analog converter (DAC), or a phase-locked loop (PLL).

The logic device 200 may include a first surface 202 on a wiring structure 220 side, and a second surface 204 on a logic substrate 210 side that is an opposite side to the first surface 202. As an example, the first surface 202 may be an upper surface of the logic device 200 and the second surface 204 may be a bottom surface of the logic device 200. In the logic device 200, a plurality of TSV contacts 255 may be formed to penetrate the logic substrate 210. An insulating layer 238 and a logic redistribution structure 240 may be formed on the second surface 204 of the logic device 200. The logic redistribution structure 240 may include a plurality of logic redistribution lines 242, and a redistribution insulating layer 244 covering the plurality of logic redistribution lines 242. The plurality of logic redistribution lines 242 may be connected to the wiring structure 220 included in the logic device 200. The plurality of logic redistribution lines 242 may be connected to conductive pads 230 exposed on the second surface 204 of the logic device 200, the second surface 204 corresponding to a back side of the logic substrate 210. Each of the plurality of TSV contacts 255 may be connected to one of a plurality of connection terminals 248 via the logic redistribution structure 240 and an under-bump metallization (UBM) layer 246. A first end of each of the plurality of TSV contacts 255 may be connected to a wiring layer 224 included in the wiring structure 220, and thereof second end of each of the plurality of TSV contact 255 may be connected to a logic redistribution line 242 of the logic redistribution structure 240.

Referring again to FIG. 2A, in an exemplary embodiment of the present inventive concept, each of the plurality of die areas DA may include a memory device.

Figure 5:
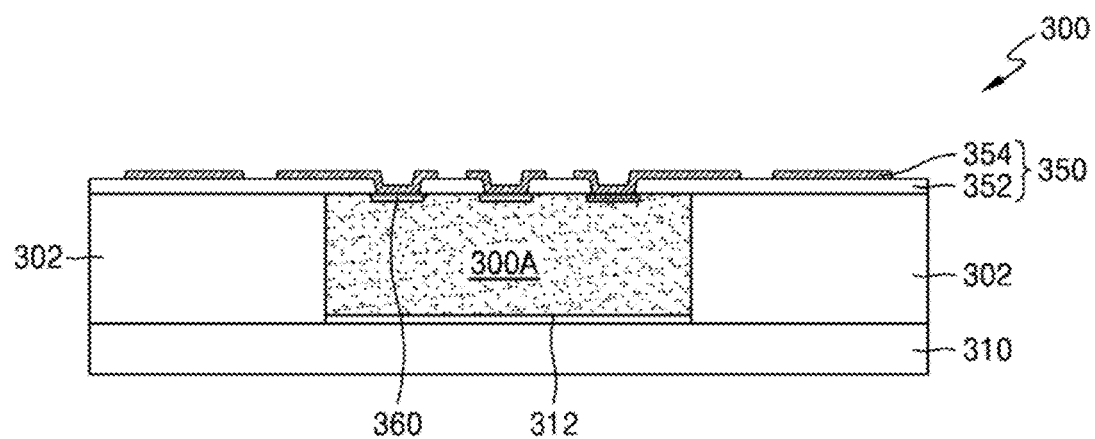
FIG. 5 is a cross-sectional view of a memory device according to an exemplary embodiment of the present inventive concept.

FIG. 5 is a cross-sectional view of a memory device according to an exemplary embodiment of the present inventive concept. The memory device described with reference to FIG. 5 may be included in each of the plurality of die areas DA described in more detail above with reference to FIG. 2A.

Referring to FIG. 5, a memory device 300 may include a memory chip 300A. The memory chip 300A may be obtained by forming memory devices on a wafer, followed by separating the wafer into a plurality dies by performing a passivation process and a sawing process. The memory chip 300A may be positioned between upper and lower surfaces of the memory device 300.

In an exemplary embodiment of the present inventive concept, the memory chip 300A may include a dynamic random access memory (DRAM), static random access memory (SRAM), phase-change random access memory (PRAM), magnetoresistive random access memory (MRAM), ferroelectric random access memory (FeRAM), resistive random access memory (RRAM), flash memory, or electrically erasable programmable read-only memory (EEPROM) device.

The memory chip 300A may be sealed on a lower substrate 310 by a molding unit 302. The molding unit 302 may be formed around the memory chip 300A to cover sidewalls of the memory chip 300A. Thus, the molding unit 302 may be in direct contact with side surfaces of the memory chip 300A. The molding unit 302 may include an epoxy resin. In an exemplary embodiment of the present inventive concept, the memory chip 300A may be attached onto the lower substrate 310 by a die bonding film 312. However, exemplary embodiments of the present inventive concept are not limited thereto. For example, the die bonding film 312 may be omitted and the memory chip 300A may be in direct contact with the lower substrate 310.

The lower substrate 310 may include a multilayer wiring structure and an insulating layer insulating the multilayer wiring structure. In an exemplary embodiment of the present inventive concept, the lower substrate 310 may be omitted.

The memory chip 300A may include a plurality of chip pads 360. The chip pads 360 may be disposed on an upper surface of the memory chip 300A. The chip pads 360 may be in direct contact with the upper surface of the memory chip 300A (e.g., a side of the opposite the lower substrate 310). The plurality of chip pads 360 may each include a conductive layer exposed outside the memory chip 300A. Electrical signals may be input or output, via the plurality of chip pads 360, from outside the memory chip 300A to an inside of the memory chip 300A, or from inside the memory chip 300A to an outside of the memory chip 300A. The plurality of chip pads 360 may be formed in various numbers and shapes depending, for example, on the type or properties of the memory chip 300A.

The memory device 300 may include a memory redistribution structure 350 arranged on the memory chip 300A and the molding unit 302. The memory redistribution structure 350 may include an insulating layer 352 substantially covering the memory chip 300A and the molding unit 302, and a plurality of memory redistribution lines 354 formed on the insulating layer 352. The plurality of chip pads 360 may be connected to the memory redistribution lines 354. Input/output (I/O) terminal wiring lines of the memory chip 300A may be connected to the memory redistribution lines 354 via the plurality of chip pads 360.

Referring again to FIG. 2A, in an exemplary embodiment of the present inventive concept, each of the plurality of die areas DA may include a stack structure in which at least two of the image sensor 100 (see, e.g., FIGS. 3A and 3B), the logic device 200 (see, e.g., FIG. 4), or the memory device 300 (see, e.g., FIG. 5) are stacked to vertically overlap each other. For example, the at least two of the image sensor 100 (see, e.g., FIGS. 3A and 3B), the logic device 200 (see, e.g., FIG. 4), or the memory device 300 (see, e.g., FIG. 5) may overlap each other along a direction orthogonal to a lower surface of the memory chip 300A.

Figure 6:
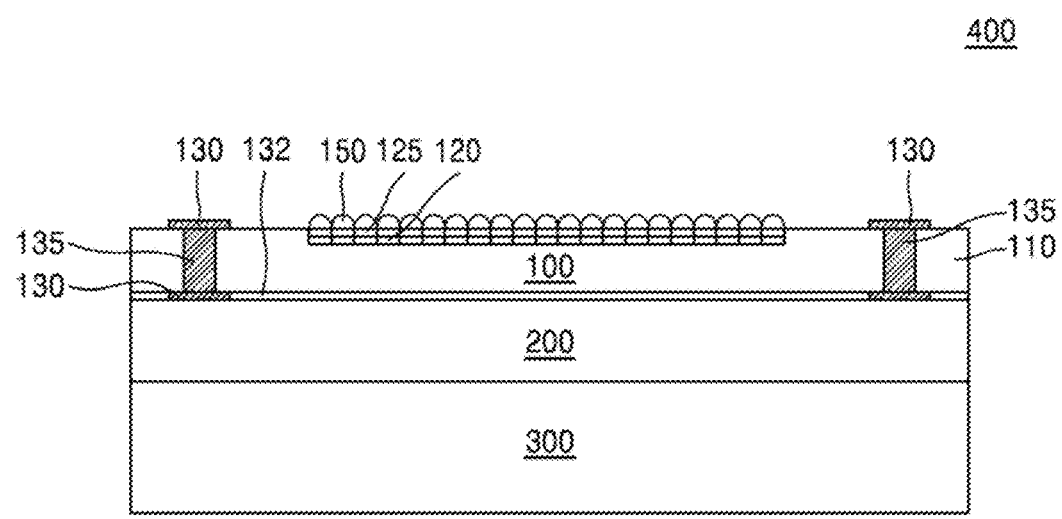
FIG. 6 is a cross-sectional view of an image sensor stack structure according to an exemplary embodiment of the present inventive concept.

FIG. 6 is a cross-sectional view of an image sensor stack structure according to an exemplary embodiment of the present inventive concept.

Referring to FIG. 6, an image sensor stack structure 400 may include the image sensor 100, the logic device 200, and the memory device 300 arranged to vertically overlap each other (e.g., sequentially stacked on each other along a direction orthogonal to a lower surface of the memory chip 300A).

Figure 2B:
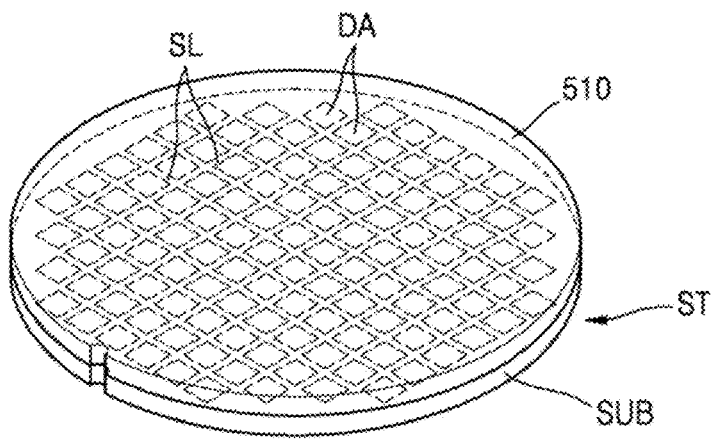

Referring to FIGS. 1 and 2B, in a process P14 according to an exemplary embodiment of the present inventive concept, a sawing protective film 510 may be formed on the semiconductor structure ST formed in the process P12, by using the protective film composition according to an exemplary embodiment of the present inventive concept.

To form the sawing protective film 510, the protective film composition according to an exemplary embodiment of the present inventive concept may be spin-coated on the semiconductor structure ST, followed by performing a soft-baking process in which the solvent included in the protective film composition is volatilized by applying heat to the coated protective film composition. The soft-baking process may be performed at a temperature selected from a range of from about 105° C. to about 130° C., for example, at a temperature of about 120° C.

Figure 7:
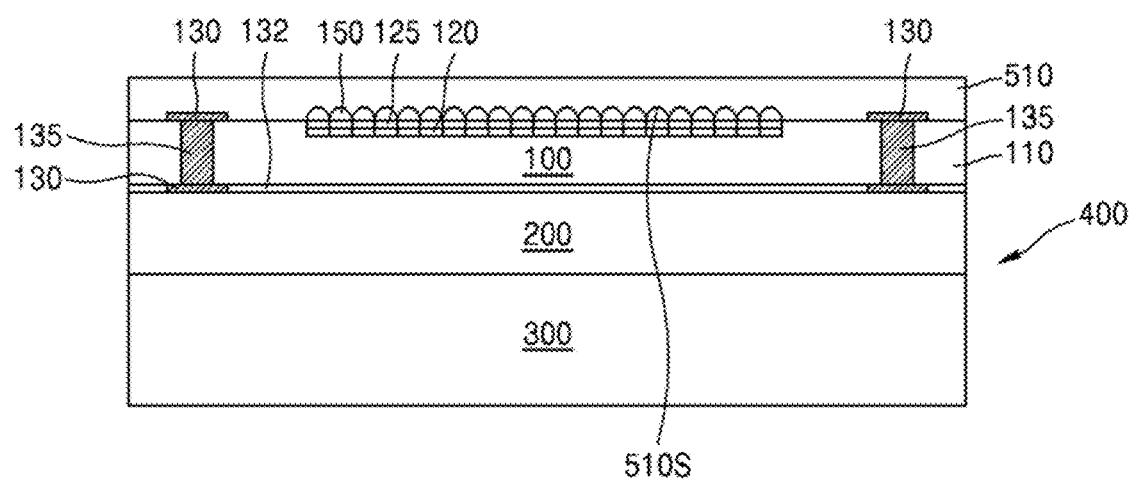
FIG. 7 is a cross-sectional view of a sawing protective film formed on an image sensor stack structure according to an exemplary embodiment of the present inventive concept.

FIG. 7 is a cross-sectional view of a sawing protective film formed on an image sensor stack structure according to an exemplary embodiment of the present inventive concept.

Referring to FIG. 7, the sawing protective film 510 may be formed to directly contact the plurality of microlenses 150 included in the image sensor 100 of the image sensor stack structure 400. The plurality of microlenses 150 may be relatively sensitive to contamination due to particles with respect to other portions of the image sensor 100. The plurality of microlenses 150 may be substantially covered with the sawing protective film 510, and thus contamination of the plurality of microlenses 150 and the image sensor stack structure 400 including the plurality of microlenses 150 may be prevented in a subsequent process.

The protective film composition according to an exemplary embodiment of the present inventive concept may include the polymer having Formula (1). The polymer having Formula (1) may include an acrylate monomer unit and/or a methacrylate monomer unit and thus may have relatively high transmittance. Therefore, when a subsequent sawing process is performed while the sawing protective film 510 is formed on the image sensor stack structure 400, even though chip alignment keys formed in the plurality of die areas DA are covered with the sawing protective film 510, the chip alignment keys may be sufficiently recognized by a sawing machine. For example, the sawing protective film may be sufficiently transparent that the chip alignment key is visible to either a machine operator or to a sensor of an automated sawing machine. In addition, the sawing protective film 510 may be maintained bonded, with relatively strong adhesion, onto a surface of the image sensor 100. Therefore, during the subsequent sawing process, the sawing protective film 510 may protect the surface of the image sensor 100 without being peeled off or detached from the surface of the image sensor 100.

After the sawing protective film 510 is formed, a bottom surface of the sawing protective film 510 may have concave surfaces 510S in direct contact with the plurality of microlenses 150 in correspondence with shapes of the plurality of microlenses 150 included in the image sensor 100. Therefore, since the sawing protective film 510 substantially covers the plurality of microlenses 150 without separation spaces between the sawing protective film 510 and the plurality of microlenses 150, the plurality of microlenses 150 may be protected by the sawing protective film 510.

Figure 2C:
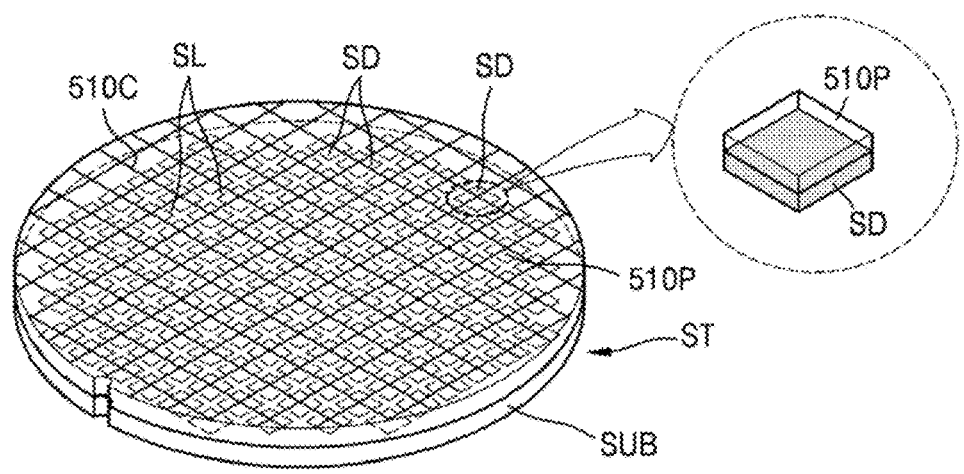

Referring to FIGS. 1 and 2C, in a process P16 according to an exemplary embodiment of the present inventive concept, when the sawing protective film 510 substantially covers the semiconductor structure ST, the sawing protective film 510 and the semiconductor structure ST may be sawed from a surface of the sawing protective film 510 along the scribe lanes SL.

The sawing process may be performed by using a blade or a laser beam. Referring to FIG. 2C, cutting lines 510C may be formed in the sawing protective film 510 during the sawing process. After the sawing process is performed, the semiconductor structure ST may be individualized into a plurality of semiconductor dies SD, and the sawing protective film 510 may be divided into a plurality of sawing protective patterns 510P.

While the sawing process is performed according to the process P16, scattering particles generated from cut surfaces of components of the semiconductor structure ST may be attached onto the surface of the sawing protective film 510. Since the semiconductor structure ST is covered with the sawing protective film 510, surfaces of the plurality of semiconductor dies SD, for example, surfaces of the plurality of microlenses 150, which are sensitive to contamination such as particles, might not be contaminated with foreign substances such as particles.

Figure 2D:
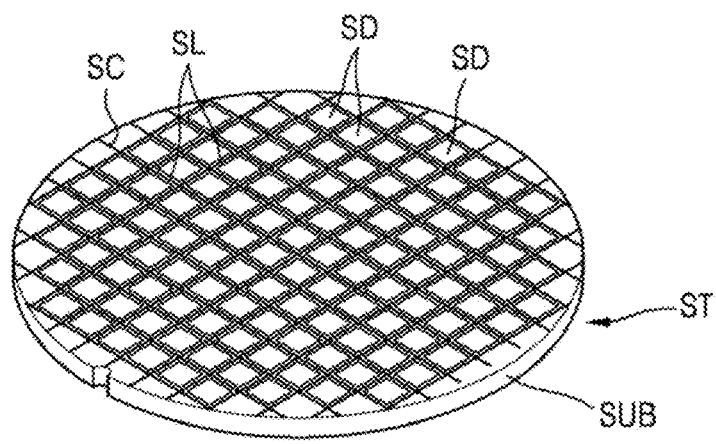

Referring to FIGS. 1 and 2D, in a process P18 according to an exemplary embodiment of the present inventive concept, the sawing protective film 510 is removed. The sawing protective film 510, which may be divided into the plurality of sawing protective patterns 510P, may be removed, thus exposing a top surface of each of the plurality of semiconductor dies SD.

Referring to FIG. 2D, cutting lines SC may be formed in the semiconductor structure ST as a result of performing the sawing process. For example, the cutting lines SC may be formed during the process P16.

To remove the sawing protective film 510, an alkaline aqueous solution may be used. In an exemplary embodiment of the present inventive concept, the alkaline aqueous solution may include a TMAH aqueous solution having a concentration of from about 2 wt % to about 5 wt %.

A process of removing the sawing protective film 510 may be performed at room temperature. In an exemplary embodiment of the present inventive concept, to remove the sawing protective film 510, a 2.38 wt % TMAH aqueous solution may be applied onto a top surface of the sawing protective film 510, and then left alone for a predetermined time, for example, about 30 seconds to about 1 minute, thus dissolving the sawing protective film 510 with the 2.38 wt % TMAH aqueous solution.

Next, a cleaning process, in which a result product obtained by dissolving the sawing protective film 510 and foreign substances such as particles remaining on the surface of the sawing protective film 510 are removed by using DIW, and a drying process for removing DIW remaining on a surface of each of the plurality of semiconductor dies SD may be performed. During the cleaning process and the drying process, a spin process, in which the plurality of semiconductor dies SD are rotated, may be substantially simultaneously performed. Alternatively, the spin process may be performed after the cleaning and drying processes. Thus, the cleaning, drying and spin processes may be sequentially performed as a single continuous process.

Figure 8:
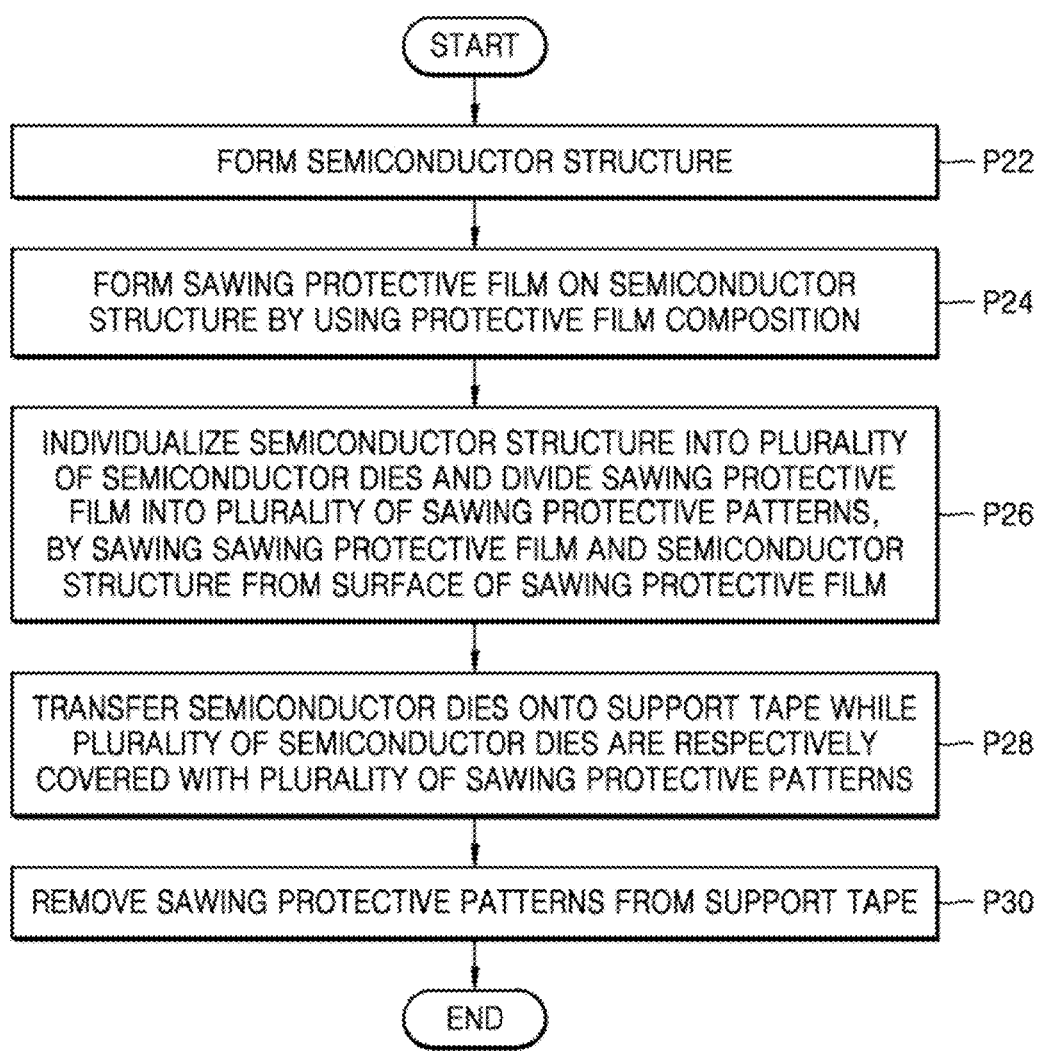
FIG. 8 is a flowchart of a method of manufacturing a semiconductor package according to an exemplary embodiment of the present inventive concept.

FIG. 8 is a flowchart of a method of manufacturing a semiconductor package according to an exemplary embodiment of the present inventive concept.

Referring to FIGS. 8 and 2A, in a process P22 according to an exemplary embodiment of the present inventive concept, the semiconductor structure ST is formed.

To form the semiconductor structure ST, the processes described regarding the process P12 with reference to FIGS. 1 and 2A may be performed. Each of the plurality of die areas DA included in the semiconductor structure ST may include a stack structure including the image sensor 100 (see, e.g., FIGS. 3A and 3B), the logic device 200 (see, e.g., FIG. 4), the memory device 300 (see, e.g., FIG. 5), or combinations thereof. For example, the stack structure may have an identical or similar structure to the image sensor stack structure 400 described in more detail above with reference to FIG. 6.

Referring to FIGS. 8 and 2B, in a process P24 according to an exemplary embodiment of the present inventive concept, the sawing protective film 510 is formed on the semiconductor structure ST (e.g., the semiconductor structure ST formed in the process P22), by using the protective film composition according to an exemplary embodiment of the present inventive concept.

To form the sawing protective film 510, the processes described regarding the process P14 with reference to FIGS. 1 and 2B may be performed.

Referring to FIGS. 8 and 2C, in a process P26 according to an exemplary embodiment of the present inventive concept, the semiconductor structure ST is individualized (e.g., cut by sawing) into a plurality of semiconductor dies SD and the sawing protective film 510 is divided into a plurality of sawing protective patterns 510P by sawing the sawing protective film 510 and the semiconductor structure ST from a surface of the sawing protective film 510. For example, when the sawing protective film 510 substantially covers the semiconductor structure ST, the sawing protective film 510 and the semiconductor structure ST may be sawed from the surface (e.g., from the upper surface) of the sawing protective film 510 along the scribe lanes SL, thus individualizing the semiconductor structure ST into the plurality of semiconductor dies SD and dividing the sawing protective film 510 into the plurality of sawing protective patterns 510P.

To saw the sawing protective film 510 and the semiconductor structure ST, the processes described with reference to FIGS. 1 and 2C may be performed.

Figure 9A:
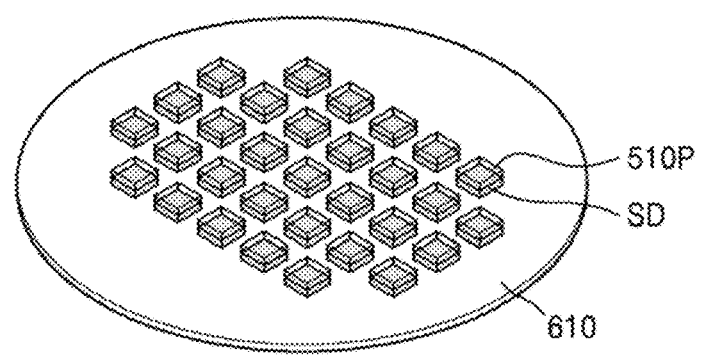
FIGS. 9A and 9B illustrate processes of the method of manufacturing a semiconductor package according to FIG. 8.
Figure 9B:
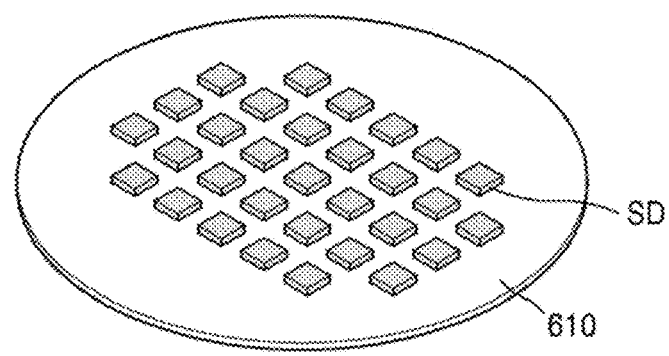

FIGS. 9A and 9B illustrate processes of the method of manufacturing a semiconductor package according to FIG. 8.

Referring to FIGS. 8 and 9A, in a process P28 according to an exemplary embodiment of the present inventive concept, the semiconductor dies SD are transferred onto a support tape 610 while the plurality of semiconductor dies SD are respectively covered with the plurality of sawing protective patterns 510P. For example, when each of the plurality of semiconductor dies SI) is substantially covered with a sawing protective pattern 510P, a die transfer process, in which each semiconductor die SD is transferred onto the support tape 610, may be performed.

In performing the die transfer process, the plurality of semiconductor dies SD obtained in the sawing process according to the process P26 may be classified into good dies and bad dies, and the die transfer process may be performed only for dies classified as the good dies among the plurality of semiconductor dies SD. For example, bad dies may refer to dies including an error or defect.

In an exemplary embodiment of the present inventive concept, to perform the die transfer process, a vacuum pick-up process, in which each semiconductor die SD is individually picked up, may be performed, and each vacuum-picked-up semiconductor die SD may be transferred and bonded onto the support tape 610. The support tape 610 may include a UV curable adhesive layer.

During the vacuum pick-up process in which each semiconductor die SD is individually picked up, foreign substances such as particles attached to a vacuum pick-up device may be transferred to a pick-up target, and thus may cause the pick-up target to be contaminated. However, according to an exemplary embodiment of the present inventive concept, the vacuum pick-up process, in which each semiconductor die SD is individually picked up, may be performed while each semiconductor die SD is covered with the sawing protective pattern 510P. Therefore, since each semiconductor die SD is protected by the sawing protective pattern 510P during the die transfer process in which each semiconductor die SI) is transferred onto the support tape 610, each semiconductor die SD might not be contaminated with foreign substances such as particles.

Referring to FIGS. 8 and 9B, in a process P30 according to an exemplary embodiment of the present inventive concept, the sawing protective pattern 510P may be removed from the support tape 610. Thus, the top surface of each of the plurality of semiconductor dies SD on the support tape 610 may be exposed.

To remove the sawing protective pattern 510P, as described with reference to FIGS. 1 and 2D, the process of removing the sawing protective film 510 divided into the plurality of sawing protective patterns 510P, according to the process P18, may be used.

Figure 10:
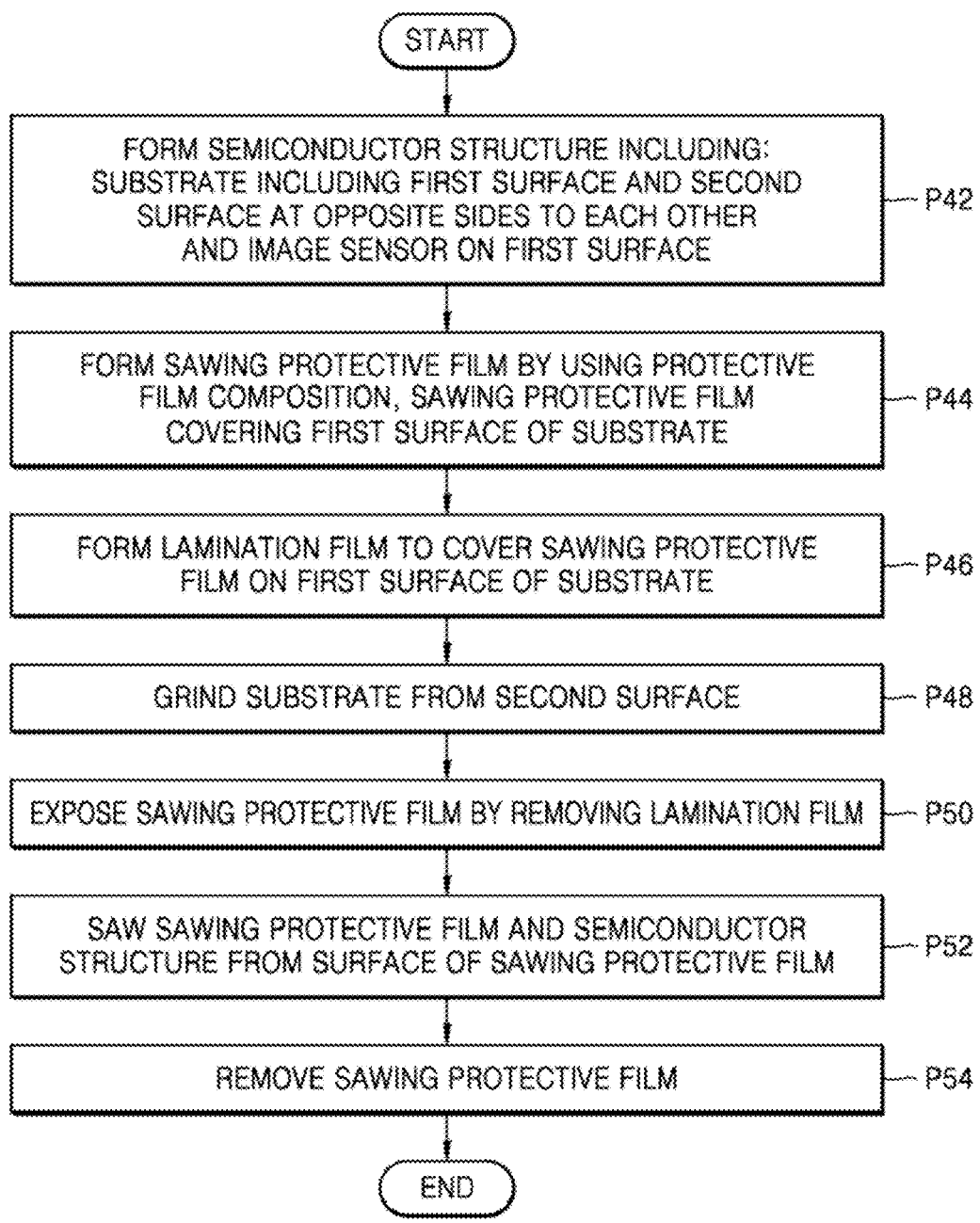
FIG. 10 is a flowchart of a method of manufacturing a semiconductor package according to an exemplary embodiment of the present inventive concept.

FIG. 10 is a flowchart of a method of manufacturing a semiconductor package according to an exemplary embodiment of the present inventive concept.

FIGS. 11A, 11B, 11C, 11D, 11E, 11F and 11G illustrate processes of the method of manufacturing a semiconductor package according to FIG. 10.

Figure 11A:
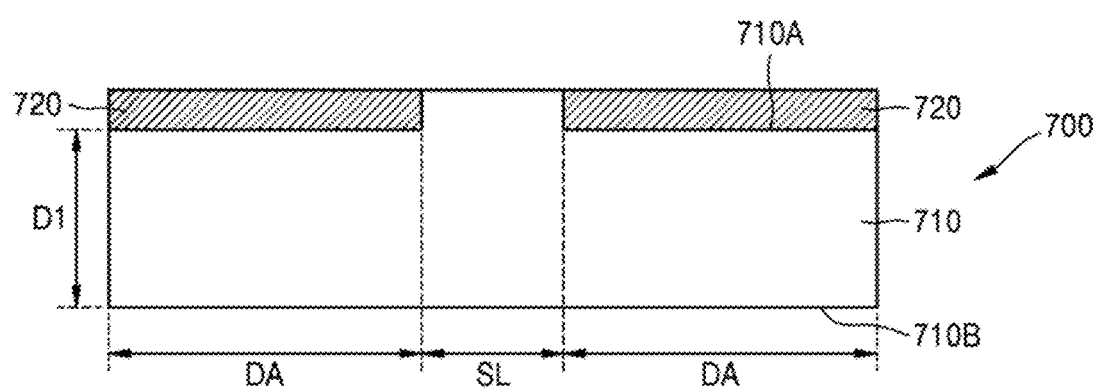
FIGS. 11A, 11B, 11C, 11D, 11E, 11F and 11G illustrate processes of the method of manufacturing a semiconductor package according to FIG. 10.

Referring to FIGS. 10 and 11A, in a process P42 according to an exemplary embodiment of the present inventive concept, a semiconductor structure 700 is formed. The semiconductor structure 700 may include a substrate 710 including a first surface 710A and a second surface 710BB at opposite sides to each other and an image sensor (e.g., image sensor 100) on the first surface 710A. A plurality of semiconductor devices 720 may be formed on active surfaces of a plurality of die areas DA included in the substrate 710.

The plurality of die areas DA in the substrate 710 may be separated from each other by scribe lanes SL. The substrate 710 may include a first surface 710A and a second surface 710B at opposite sides to each other. The first surface 710A may be the active surfaces of the plurality of die areas DA. The substrate 710 may have a first thickness D1.

In an exemplary embodiment of the present inventive concept, the plurality of semiconductor devices 720 may each include the image sensor 100 (see, e.g., FIGS. 3A and 3B). Referring to FIG. 3B, the image sensor 100 may include the sensor array region SAR including the plurality of microlenses 150 and the plurality of unit pixels 120. The plurality of unit pixels 120 may each be an active pixel sensor.

Figure 11B:
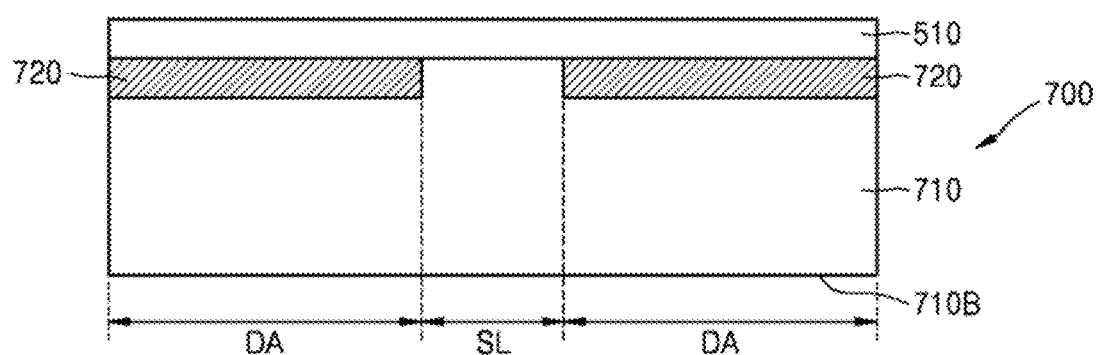

Referring to FIGS. 10 and 11B, in a process P44 according to an exemplary embodiment of the present inventive concept, the sawing protective film 510 is formed by using a protective film composition and sawing the protective film 510 covering the first surface 710A of the substrate 710. The sawing protective film 510 may be formed on the semiconductor structure 700 formed in the process P42, by using the protective film composition according to the inventive concept.

The sawing protective film 510 may be formed to substantially cover the plurality of semiconductor devices 720 on the first surface 710A.

To form the sawing protective film 510, the processes P14 described with reference to FIGS. 1 and 2B may be performed.

Figure 11C:
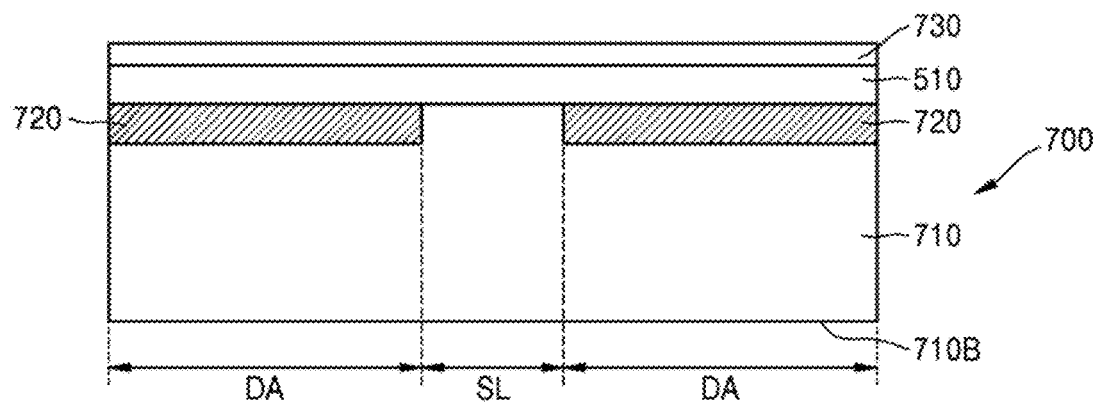

Referring to FIGS. 10 and 11C, in a process P46 according to an exemplary embodiment of the present inventive concept, a lamination film 730 is formed, the lamination film 730 covering the sawing protective film 510 on the first surface 710A of the substrate 710.

In an exemplary embodiment of the present inventive concept, the lamination film 730 may include a polyvinylchloride (PVC)-based polymer sheet, and an acrylic resin-based UV curable adhesive layer. The lamination film 730 may be attached onto the sawing protective film 510 by the adhesive layer. As an example, the lamination film 730 may be in direct contact with the sawing protective film 510. For example, the lamination film 730 may be in direct contact with an upper surface of the sawing protective film 730 facing away from the substrate 710.

Figure 11D:
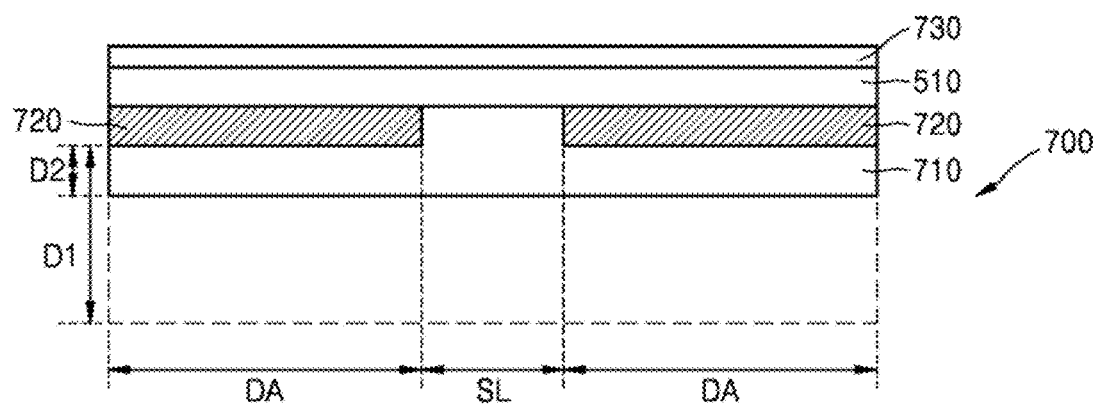

Referring to FIGS. 10 and 11D, in a process P48 according to an exemplary embodiment of the present inventive concept, the substrate 710 is ground from the second surface 710B of the substrate 710.

To grind the substrate 710, the semiconductor structure 700 may be rearranged such that the lamination film 730 faces downwards and the second surface 710B of the substrate 710 faces upwards. After the substrate 710 is ground from the second surface 710B thereof, the substrate 710 may have a second thickness D2 that is less than the first thickness D1 (see, e.g., FIG. 11A).

During the grinding of the substrate 710, heat and pressure may be applied to the sawing protective film 510 and the lamination film 730. The sawing protective film 510 obtained from the protective film composition according to an exemplary embodiment of the present inventive concept may have relatively low reactivity with the lamination film 730. Therefore, even when heat and pressure are applied to the sawing protective film 510 and the lamination film 730 during the grinding of the substrate 710, an undesired reaction between the sawing protective film 510 and the lamination film 730 may be prevented.

Figure 11E:
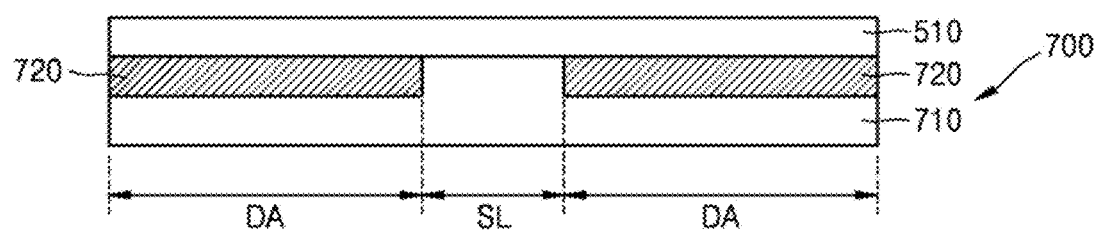

Referring to FIGS. 10 and 11E, in a process P50 according to an exemplary embodiment of the present inventive concept, the lamination film 730 (see, e.g., FIG. 11D) is removed, thus exposing the sawing protective film 510.

To remove the lamination film 730, the lamination film 730 may be irradiated with ultraviolet (UV) light.

Referring to FIG. 11D, the sawing protective film 510 may have relatively low reactivity with the lamination film 730. Therefore, when the lamination film 730 is separated from the sawing protective film 510, an occurrence of portions of the sawing protective film 510 remaining on the lamination film 730, or an occurrence of detachment of the sawing protective film 510 from the semiconductor structure 700 may be prevented.

Figure 11F:
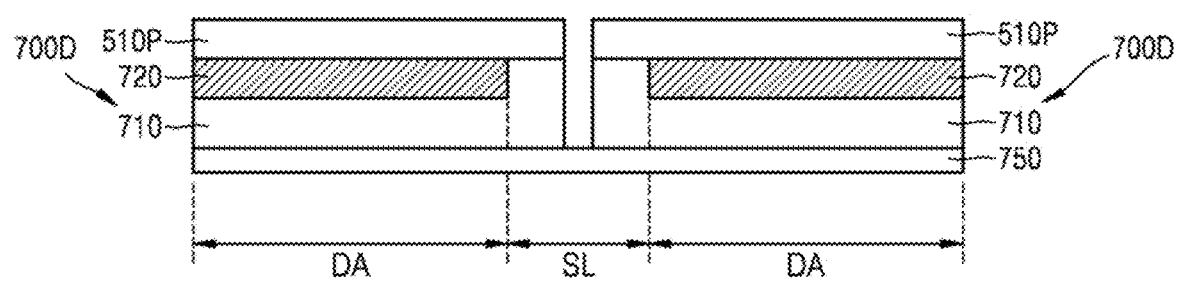

Referring to FIGS. 10 and 11F, in a process P52 according to an exemplary embodiment of the present inventive concept, the sawing protective film 510 and the semiconductor structure 700 are sawed from a surface of the sawing protective film 510. As an example, the semiconductor structure 700 (see, e.g., FIG. 11E) may be transferred onto a support tape 750 while being substantially covered with the sawing protective film 510, followed by sawing the sawing protective film 510 and the semiconductor structure 700 from the surface of the sawing protective film 510 along the scribe lanes SL, thereby individualizing the semiconductor structure 700 into a plurality of semiconductor dies 700D and dividing the sawing protective film 510 into the plurality of sawing protective patterns 510P.

To saw the sawing protective film 510 and the semiconductor structure 700, the processes described with reference to FIGS. 1 and 2C may be performed. The support tape 750 may include a UV curable adhesive layer. The sawing process may be performed while the plurality of semiconductor dies 700D are bonded onto the support tape 750.

Figure 11G:
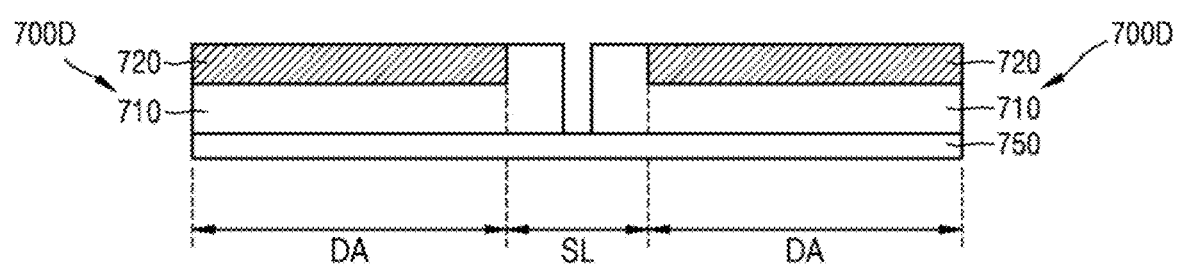

Referring to FIGS. 10 and 11G, in a process P54 according to an exemplary embodiment of the present inventive concept, the sawing protective film 510 is removed. For example, the plurality of sawing protective patterns 510P may be removed, thus exposing a top surface of each of the plurality of semiconductor devices 720.

To remove the plurality of sawing protective patterns 510P, as described with reference to FIGS. 1 and 2D, the process P18 of removing the sawing protective film 510 divided into the plurality of sawing protective patterns 510P may be used.

Examples of synthesizing polymers that may be included in the protective film composition according to an exemplary embodiment of the present inventive concept, and examples of preparing the protective film composition will be described in more detail below.

It should be understood that the scope of the present inventive concept is not limited to the following examples.

Synthesis Examples 1 to 40

Synthesis of Polymers 1 to 40

To synthesize polymers 1 to 40, methacrylic acid (MAA), monomers marked by b1 to b9, and monomers marked by c1 to c15 may be used.

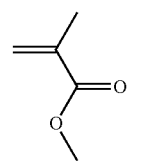

b1

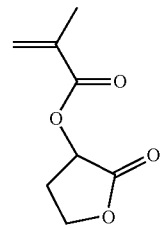

b2

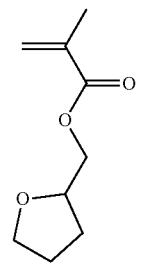

b3

-continued
b4
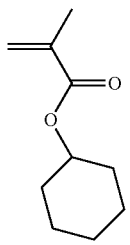
b5
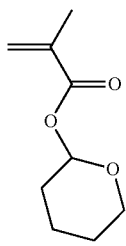
b6
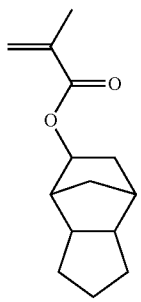
b7
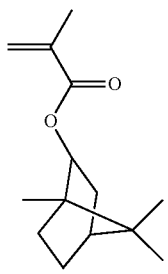
b8
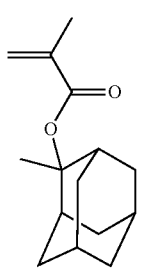
-continued
b9
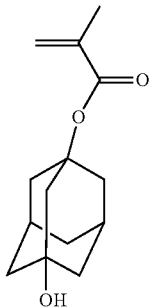
c1
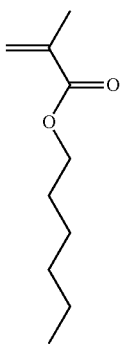
c2
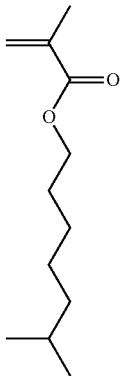
c3
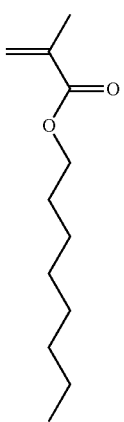

c4
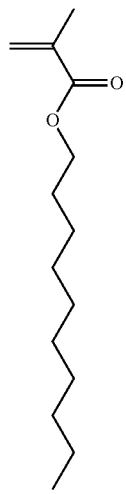
c5
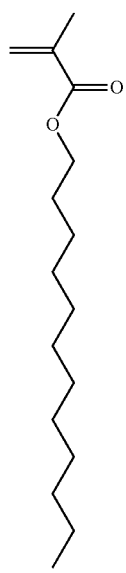
c6
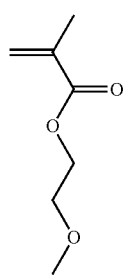
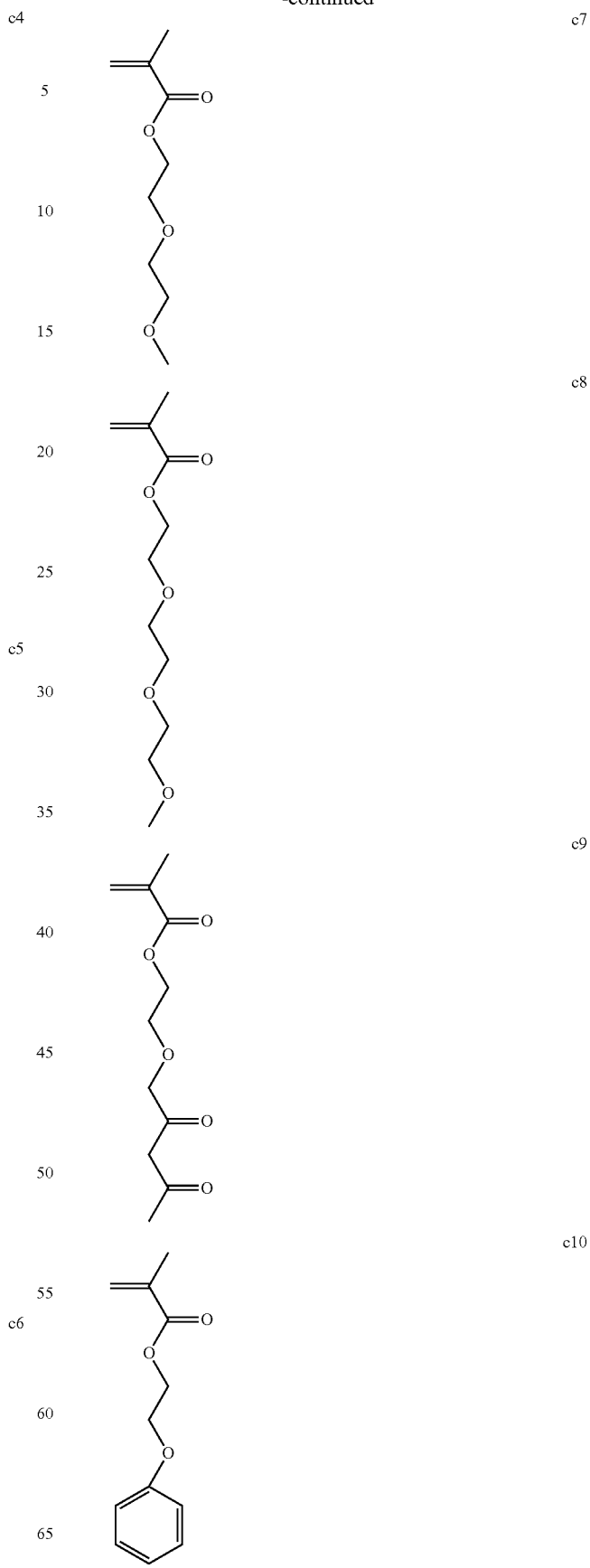

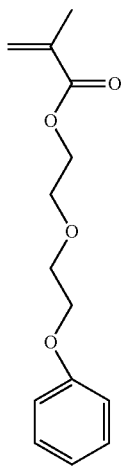

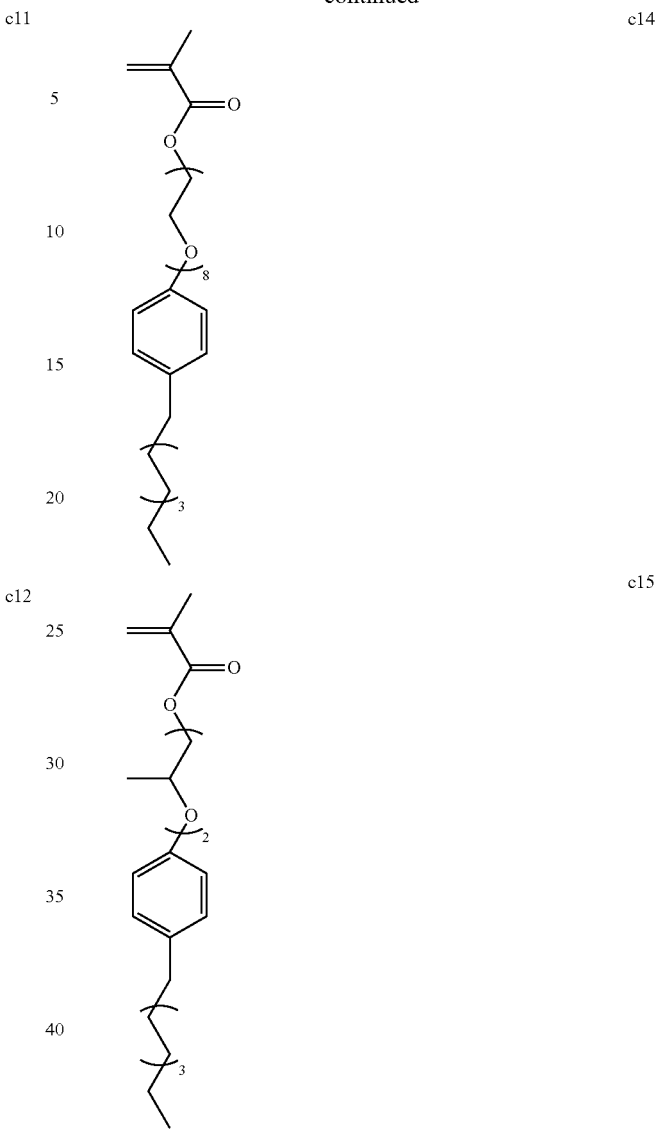

To synthesize a polymer 1, 20 mol % (3.22 g) of MAA, 30 mol % (5.61 g) of a monomer b1, 50 mol % (20.0 g) of a monomer c1, and 0.06 g of 2,2'-azobisisobutyronitrile (AIBN) corresponding to a radical reaction initiator may be dissolved in 62.31 g of propylene glycol monomethyl ether acetate (PGMEA) such that a monomer solid concentration was 33.3%, followed by performing a radical reaction simultaneously with stirring, at 80° C. for 14 hours by using an oil bath. After the completion of the radical reaction, the reaction solution may be cooled to room temperature (25° C.), and then purified through precipitation to remove remaining impurities that was not reacted, for example, unreacted monomers, oligomers having low molecular weights, and foreign substances. Heptane may be used as a precipitation solvent, and polymer solids may be precipitated, by using the precipitation solvent in an amount of 10 times a total weight of the reaction solution, and then filtered, thus obtaining precipitates. The obtained polymer solids may be dried at a temperature of 60° C. for 24 hours by using a vacuum drier. A weight average molecular weight of the obtained polymer may be measured by using a gel permeation chromatography (GPC) analyzer, and exemplary results thereof are shown in Table 1.

To synthesize polymers 2 to 40, MAA, the monomers marked by b1 to b9, and the monomers marked by c1 to c15 may be variously combined according to amounts listed in Table 1, followed by inducing radical reactions by dissolving the corresponding combined components in PGMEA in the same manner as in the synthesis of the polymer 1, thus synthesizing respective polymers. Exemplary weight average molecular weights of the obtained polymers are shown in Table 1.

at 120° C. for 2 minutes by using a hot-plate, thus obtaining sawing protective films respectively including the polymers 1 to 40.

Thicknesses of the obtained sawing protective films may be measured by using Opti 2600 (produced by KLA-Tencor Co., Ltd.), and exemplary results thereof are shown in Table 2.

The obtained sawing protective films may be evaluated as to thickness non-uniformity and whether breakage occurred

TABLE 1

|  | Monomer a | mol % | Monomer b | mol % | Monomer c | mol % | Molecular weight | Polydispersity index |
|---|---|---|---|---|---|---|---|---|
| Polymer 1 | MAA | 20 | b-1 | 30 | c-1 | 50 | 64,000 | 2.28 |
| Polymer 2 | MAA | 20 | b-1 | 30 | c-2 | 50 | 62,000 | 2.31 |
| Polymer 3 | MAA | 20 | b-1 | 30 | c-3 | 50 | 70,241 | 2.28 |
| Polymer 4 | MAA | 20 | b-1 | 30 | c-4 | 50 | 70,200 | 2.31 |
| Polymer 5 | MAA | 20 | b-1 | 30 | c-5 | 50 | 70,000 | 2.3 |
| Polymer 6 | MAA | 20 | b-1 | 30 | c-6 | 50 | 68,000 | 2.21 |
| Polymer 7 | MAA | 20 | b-1 | 30 | c-7 | 50 | 69,000 | 2.31 |
| Polymer 8 | MAA | 20 | b-1 | 30 | c-8 | 50 | 70,000 | 2.3 |
| Polymer 9 | MAA | 20 | b-1 | 30 | c-9 | 50 | 72,000 | 2.3 |
| Polymer 10 | MAA | 20 | b-1 | 30 | c-10 | 50 | 75,000 | 2.4 |
| Polymer 11 | MAA | 20 | b-1 | 30 | c-11 | 50 | 76,000 | 2.31 |
| Polymer 12 | MAA | 20 | b-1 | 30 | c-12 | 50 | 80,000 | 2.25 |
| Polymer 13 | MAA | 20 | b-1 | 30 | c-13 | 50 | 80,000 | 2.23 |
| Polymer 14 | MAA | 20 | b-1 | 30 | c-14 | 50 | 80,000 | 2.24 |
| Polymer 15 | MAA | 20 | b-1 | 30 | c-15 | 50 | 80,000 | 2.31 |
| Polymer 16 | MAA | 20 | b-2 | 30 | c-7 | 50 | 68,000 | 2.32 |
| Polymer 17 | MAA | 20 | b-3 | 30 | c-7 | 50 | 69,000 | 2.31 |
| Polymer 18 | MAA | 20 | b-4 | 30 | c-7 | 50 | 67,000 | 2.31 |
| Polymer 19 | MAA | 20 | b-5 | 30 | c-7 | 50 | 68,000 | 2.3 |
| Polymer 20 | MAA | 20 | b-6 | 30 | c-7 | 50 | 69,000 | 2.29 |
| Polymer 21 | MAA | 20 | b-7 | 30 | c-7 | 50 | 68,000 | 2.3 |
| Polymer 22 | MAA | 20 | b-8 | 30 | c-7 | 50 | 67,000 | 2.24 |
| Polymer 23 | MAA | 20 | b-9 | 30 | c-7 | 50 | 66,500 | 2.14 |
| Polymer 24 | MAA | 20 | b-2 | 30 | c-9 | 50 | 72,000 | 2.31 |
| Polymer 25 | MAA | 20 | b-3 | 30 | c-9 | 50 | 71,000 | 2.32 |
| Polymer 26 | MAA | 20 | b-4 | 30 | c-9 | 50 | 70,000 | 2.31 |
| Polymer 27 | MAA | 20 | b-5 | 30 | c-9 | 50 | 67,000 | 2.31 |
| Polymer 28 | MAA | 20 | b-6 | 30 | c-9 | 50 | 65,000 | 2.25 |
| Polymer 29 | MAA | 20 | b-7 | 30 | c-9 | 50 | 67,000 | 2.31 |
| Polymer 30 | MAA | 20 | b-8 | 30 | c-9 | 50 | 64,000 | 2.21 |
| Polymer 31 | MAA | 20 | b-9 | 30 | c-9 | 50 | 67,000 | 2.26 |
| Polymer 32 | MAA | 20 | b-2 | 30 | c-11 | 50 | 70,000 | 2.22 |
| Polymer 33 | MAA | 20 | b-3 | 30 | c-11 | 50 | 71,000 | 2.24 |
| Polymer 34 | MAA | 20 | b-4 | 30 | c-11 | 50 | 71,500 | 2.31 |
| Polymer 35 | MAA | 20 | b-5 | 30 | c-11 | 50 | 72,000 | 2.32 |
| Polymer 36 | MAA | 20 | b-6 | 30 | c-11 | 50 | 72,000 | 2.31 |
| Polymer 37 | MAA | 5 | b-1 | 45 | c-7 | 50 | 67,000 | 2.31 |
| Polymer 38 | MAA | 35 | b-1 | 15 | c-7 | 50 | 65,000 | 2.25 |
| Polymer 39 | MAA | 20 | b-1 | 10 | c-7 | 70 | 70,000 | 2.23 |
| Polymer 40 | MAA | 20 | b-1 | 70 | c-7 | 10 | 72,000 | 2.12 |

Preparation of Composition (Examples 1 to 40)

Protective film compositions may be prepared by using the polymers 1 to 40 synthesized in Synthesis Examples 1 to 40. First, each of the polymers 1 to 40 may be dissolved in PGMEA such that a solid content is 30%. To increase adhesion between each of the protective film compositions and a coating target film on which each protective film composition is coated, N-(2-aminoethyl)-3-aminopropyltriethoxysilane (CAS No. 5089-72-5), which is a silane compound, may be added in an amount of 0.5 wt % based on a total weight of each polymer. Each obtained solution may be filtered by using a disc filter having a pore size of 0.45 m, and then spin-coated on a front side of a 200 mm-diameter silicon wafer at 2500 rpm for 35 seconds by using a MARK-7 coating machine (produced by TEL Co., Ltd.). For curing each coated film, each coated film may be soft-baked or not, and exemplary results thereof are shown in the "coating state" column of Table 2.

A lamination film including a UV curable adhesive layer may be attached onto a top surface of each of the obtained sawing protective films, followed by reducing the thickness of the silicon wafer by grinding a back side of the silicon wafer. Generated heat and pressure may be transferred to each of the sawing protective films and the lamination film substantially covering the top surface of each of the sawing protective films. To evaluate reactivity between each of the obtained sawing protective films and the lamination film substantially covering the top surface thereof during the back side grinding process of the silicon wafer, a degree of damage of each of the sawing protective films may be evaluated in a process of removing the lamination film after the grinding process, and exemplary results thereof are shown in Table 2 by indicating whether there was "tape reactivity" or not.

After the evaluation of the tape reactivity, to evaluate the physical strength of each of the sawing protective films, whether breakage or peeling-off of each of the sawing protective films occurred during the sawing process of the silicon wafer may be evaluated, and exemplary results thereof are shown in the "sawing" column of Table 2.

After the sawing evaluation of each of the sawing protective films, to evaluate ease of removal of sawing protective films exhibiting nothing abnormal, a process of removing each of the corresponding sawing protective films may be performed for 60 seconds in a puddle manner by using a 2.38 wt % TMAH aqueous solution. Here, a time period taken to remove each of the corresponding sawing protective films and whether each of the corresponding sawing protective films was completely removed or not may be evaluated by using an optical microscope. Exemplary results are shown in Table 2.

TABLE 2

|  | Polymer | Coating thickness (μm) | Coating state | Tape reactivity | Sawing (Breakage) | Removal time (second) | Removal result |
|---|---|---|---|---|---|---|---|
| Example 1 | Polymer 1 | 3.2 | No abnormality | Not reacted | None | 60 | Clean |
| Example 2 | Polymer 2 | 3.4 | No abnormality | Not reacted | None | 60 | Clean |
| Example 3 | Polymer 3 | 3.2 | No abnormality | Not reacted | None | 60 | Clean |
| Example 4 | Polymer 4 | 3.0 | No abnormality | Not reacted | None | 60 | Clean |
| Example 5 | Polymer 5 | 3.5 | No abnormality | Not reacted | None | 60 | Clean |
| Example 6 | Polymer 6 | 3.8 | No abnormality | Not reacted | None | 60 | Clean |
| Example 7 | Polymer 7 | 4.0 | No abnormality | Not reacted | None | 60 | Clean |
| Example 8 | Polymer 8 | 3.8 | No abnormality | Not reacted | None | 60 | Clean |
| Example 9 | Polymer 9 | 3.2 | No abnormality | Not reacted | None | 60 | Clean |
| Example 10 | Polymer 10 | 3.2 | No abnormality | Not reacted | None | 60 | Clean |
| Example 11 | Polymer 11 | 3.4 | No abnormality | Not reacted | None | 60 | Clean |
| Example 12 | Polymer 12 | 3.2 | No abnormality | Not reacted | None | 60 | Clean |
| Example 13 | Polymer 13 | 3.0 | No abnormality | Not reacted | None | 60 | Clean |
| Example 14 | Polymer 14 | 3.6 | No abnormality | Not reacted | None | 60 | Clean |
| Example 15 | Polymer 15 | 3.8 | No abnormality | Not reacted | None | 60 | Clean |
| Example 16 | Polymer 16 | 4.0 | No abnormality | Not reacted | None | 60 | Clean |
| Example 17 | Polymer 17 | 3.8 | No abnormality | Not reacted | None | 60 | Clean |
| Example 18 | Polymer 18 | 3.2 | No abnormality | Not reacted | None | 60 | Clean |
| Example 19 | Polymer 19 | 3.2 | No abnormality | Not reacted | None | 60 | Clean |
| Example 20 | Polymer 20 | 3.4 | No abnormality | Not reacted | None | 60 | Clean |
| Example 21 | Polymer 21 | 3.2 | No abnormality | Not reacted | None | 60 | Clean |
| Example 22 | Polymer 22 | 3.2 | No abnormality | Not reacted | None | 60 | Clean |
| Example 23 | Polymer 23 | 3.4 | No abnormality | Not reacted | None | 60 | Clean |
| Example 24 | Polymer 24 | 3.2 | No abnormality | Not reacted | None | 60 | Clean |
| Example 25 | Polymer 25 | 3.2 | No abnormality | Not reacted | None | 60 | Clean |
| Example 26 | Polymer 26 | 3.4 | No abnormality | Not reacted | None | 60 | Clean |
| Example 27 | Polymer 27 | 3.2 | No abnormality | Not reacted | None | 60 | Clean |
| Example 28 | Polymer 28 | 3.2 | No abnormality | Not reacted | None | 60 | Clean |
| Example 29 | Polymer 29 | 3.4 | No abnormality | Not reacted | None | 60 | Clean |
| Example 30 | Polymer 30 | 3.2 | No abnormality | Not reacted | None | 60 | Clean |
| Example 31 | Polymer 31 | 3.2 | No abnormality | Not reacted | None | 60 | Clean |
| Example 32 | Polymer 32 | 3.4 | No abnormality | Not reacted | None | 60 | Clean |
| Example 33 | Polymer 33 | 3.5 | No abnormality | Not reacted | None | 60 | Clean |
| Example 34 | Polymer 34 | 3.8 | No abnormality | Not reacted | None | 60 | Clean |
| Example 35 | Polymer 35 | 3.9 | No abnormality | Not reacted | None | 60 | Clean |
| Example 36 | Polymer 36 | 3.8 | No abnormality | Not reacted | None | 60 | Clean |
| Example 37 | Polymer 37 | 3.7 | No abnormality | Not reacted | None | 180 | Poor peeling off |
| Example 38 | Polymer 38 | 3.8 | No abnormality | Not reacted | Peeled off | 60 | — |
| Example 39 | Polymer 39 | 3.9 | No abnormality | Reacted (Scratch) | — | — | — |
| Example 40 | Polymer 40 | 3.1 | Crack | Not reacted | Broken | — | — |

Referring to Examples 1 to 40, the sawing protective film obtained from the protective film composition according to an exemplary embodiment of the present inventive concept may be resistance to external physical impacts, and when another material film including an adhesive layer is brought into contact with the sawing protective film and then separated from the sawing protective film, the sawing protective film may have no reactivity with the adhesive layer and thus might not be damaged. In addition, after the sawing protective film is formed on a substrate, while back side grinding of the substrate is performed, the sawing protective film may be maintained in a good state without being broken, and thus, die surfaces may be effectively protected by the sawing protective film. Further, since the sawing protective film may be relatively easily and quickly removed by an environmentally friendly alkaline aqueous solution, a yield of a process of manufacturing a semiconductor package by using the sawing protective film may be increased.

While the present inventive concept has been particularly shown and described with reference to exemplary embodiments thereof, it will be understood that various changes in form and details may be made therein without departing from the spirit and scope of the present inventive concept.

What is claimed is:

1. A protective film composition comprising:
   a polymer having Formula (1); and
   a solvent,

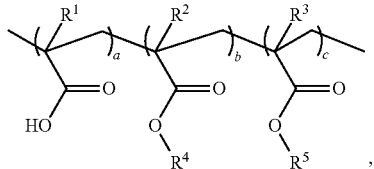

Formula (1)

wherein each of a, b, and c is a mole fraction;

$a+b+c=1$;

$0.05 \leq a/(a+b+c) \leq 0.3$;

$0.1 \leq b/(a+b+c) \leq 0.6$;

$0.1 \leq c/(a+b+c) \leq 0.6$;

each of $R^1$, $R^2$, and $R^3$ is a hydrogen atom or a methyl group;

$R^4$ is a hydrogen atom, a butyrolactonyl group, or a substituted or unsubstituted C3 to C30 alicyclic hydrocarbon group; and $R^5$ is a substituted or unsubstituted C6 to C30 linear or cyclic hydrocarbon group.

2. The protective film composition according to claim 1, wherein at least one of $R^4$ and $R^5$ comprises an ether group, a carbonyl group, an ester group, or a hydroxyl group.

3. The protective film composition according to claim 1, wherein at least one of $R^4$ and $R^5$ comprises at least one heteroatom selected from among O, S, or N.

4. The protective film composition according to claim 1, wherein $R^4$ has a structure selected from among the following structures:

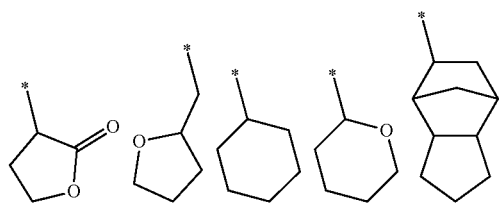

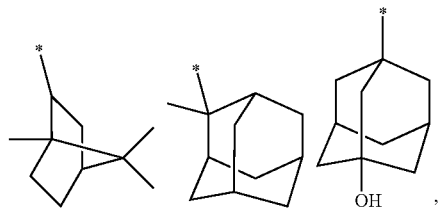

wherein the symbol "*" represents a binding site.

5. The protective film composition according to claim 1, wherein $R^5$ has a structure selected from among the following structures:

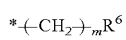

wherein the symbol "*" represents a binding site;

m is an integer selected from 2 to 15;

n is an integer selected from 1 to 10;

$R^6$ is a hydrogen atom, a methyl group, or a t-butyl group; and $R^7$ is a methyl group, a phenyl group, a C1 to C10 alkyl group-substituted phenyl group, or a C3 to C10 alkylcarbonyl group.

6. The protective film composition according to claim 1, wherein $R^5$ has a structure selected from among the following structures:

wherein the symbol "*" represents a binding site.

7. The protective film composition according to claim 1, wherein $R^5$ has a structure selected from among the following structures:

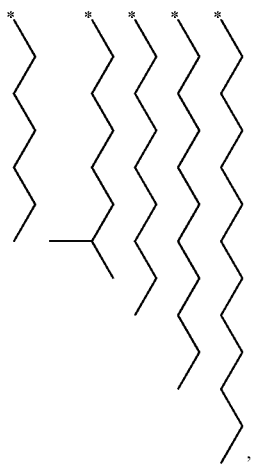

wherein the symbol "*" represents a binding site.

8. The protective film composition according to claim 1, wherein $R^5$ has a structure selected from among the following structures:

wherein the symbol "*" represents a binding site.

9. The protective film composition according to claim 1, further comprising:
a silane compound.

* * * * *